US011997317B2

(12) United States Patent
Choi et al.

(10) Patent No.: US 11,997,317 B2
(45) Date of Patent: May 28, 2024

(54) TECHNIQUES FOR CONSTRAINT FLAG SIGNALING FOR RANGE EXTENSION WITH PERSISTENT RICE ADAPTATION

(71) Applicant: Tencent America LLC, Palo Alto, CA (US)

(72) Inventors: Byeongdoo Choi, Palo Alto, CA (US); Shan Liu, San Jose, CA (US); Stephan Wenger, Hillsborough, CA (US)

(73) Assignee: TENCENT AMERICA LLC, Palo Alto, CA (US)

( * ) Notice: Subject to any disclaimer, the term of this patent is extended or adjusted under 35 U.S.C. 154(b) by 0 days.

(21) Appl. No.: 17/710,786

(22) Filed: Mar. 31, 2022

(65) Prior Publication Data

US 2023/0101189 A1 Mar. 30, 2023

Related U.S. Application Data

(60) Provisional application No. 63/250,172, filed on Sep. 29, 2021.

(51) Int. Cl.
*H04N 19/70* (2014.01)
*H04N 19/149* (2014.01)
(Continued)

(52) U.S. Cl.
CPC .......... *H04N 19/70* (2014.11); *H04N 19/149* (2014.11); *H04N 19/172* (2014.11); *H04N 19/18* (2014.11)

(58) Field of Classification Search
CPC .... H04N 19/70; H04N 19/149; H04N 19/172; H04N 19/18
See application file for complete search history.

(56) References Cited

U.S. PATENT DOCUMENTS

2022/0272378 A1* 8/2022 Samuelsson ......... H04N 19/132
2022/0337811 A1* 10/2022 Choi .................... H04N 19/176
(Continued)

FOREIGN PATENT DOCUMENTS

WO  WO-2023028555 A1 *  3/2023
WO  WO-2023028576 A2 *  3/2023

OTHER PUBLICATIONS

Bossen, Frank, et al., "VVC operation range extensions (Draft 4)", Joint Video Experts Team (JVET) of ITU-T SG 16 WP 3 and ISO/IEC JTC 1/SC 29, 23rd Meeting, by teleconference, Document: JVET-W2005-v1, Jul. 7-16, 2021 (Year: 2021).*

(Continued)

*Primary Examiner* — Dramos Kalapodas
(74) *Attorney, Agent, or Firm* — ARENTFOX SCHIFF LLP

(57) ABSTRACT

Aspects of the disclosure provide methods and apparatuses for video data processing. In some examples, an apparatus for video data processing includes processing circuitry. For example, the processing circuitry determines a first syntax element for coding control in a first scope of coded video data in a bitstream. The first syntax element is associated with a coding tool of persistent Rice adaptation defined in a range extension of a video standard for a statistics based Rice parameter derivation in a residual coding. In response to the first syntax element being a first value indicative of disabling of the coding tool in the first scope, the processing circuitry decodes the first scope of coded video data that includes one or more second scopes of coded video data without invoking the coding tool.

15 Claims, 23 Drawing Sheets

(51) Int. Cl.
*H04N 19/172* (2014.01)
*H04N 19/18* (2014.01)

(56) References Cited

U.S. PATENT DOCUMENTS

2022/0377345 A1* 11/2022 Choi .................... H04N 19/157
2022/0377353 A1* 11/2022 Zhang .................. H04N 19/513
2023/0026492 A1* 1/2023 Ikai ........................ H04N 19/44

OTHER PUBLICATIONS

Bossen, Frank, et al. "VVC operation range extensions (Draft 4)", Joint Video Experts Team (JVET) of ITU-T SG 16 WP 3 and ISO/IEC JTC 1/SC 29, 23rd Meeting, by teleconference, Document: JVET-W2005-v1, Jul. 7-16, 2021, pp. 1-30.
Bossen et al., "VVC operation range extensions (Draft 3)," Joint Video Experts Team (JVET) of ITU-T SG 16 WP 3 and ISO/IEC JTC 1/SC 29, 22nd Meeting: by teleconference, Apr. 20-28, 2021, Document: JVET-V2005-v1, 19 pages.
Extended European Search Report in EP22868418.9, mailed Jan. 29, 2024, 11 pages.
Naser et al., "[AHG8] SPS Cleanup for VVC operation range extension," Joint Video Experts Team (JVET) of ITU-T SG 16 WP 3 and ISO/IEC JTC 1/SC 29, 23rd Meeting: by teleconference, Jul. 7-16, 2021, Document: JVET-W0070, 4 pages.

* cited by examiner

Table 1: Mapping upsample or downsample factors, codewords, and Ext-Golomb codes

| Codeword | Ext-Golomb Code | Original/Target resolution |
|---|---|---|
| 0 | 1 | 1/1 |
| 1 | 010 | 1/1.5 (upscale by 50%) |
| 2 | 011 | 1.5/1 (downscale by 50%) |
| 3 | 00100 | 1/2 (upscale by 100%) |
| 4 | 00101 | 2/1 (downscale by 100%) |

*FIG. 10*

| | | |
|---|---|---|
| 1101 → | tile_group_header( ) { | |
| | ... | |
| 1103 → | if(adaptive_pic_resolution_change_flag) { | |
| 1102 → |    dec_pic_size_idx | u(1) |
| | } | |
| | ... | |
| | } | |

| | | Descriptor |
|---|---|---|
| 1110 → | seq_parameter_set_rbsp( ) { | |
| | ... | |
| 1111 → |   adaptive_pic_resolution_change_flag | u(1) |
| 1112 → |   if(adaptive_pic_resolution_change_flag) { | |
| 1113 [ |     output_pic_width_in_luma_samples | ue(v) |
| |     output_pic_height_in_luma_samples | ue(v) |
| 1114 → |     reference_pic_size_present_flag | u(1) |
| |     if(reference_pic_size_present_flag) | |
| |     { | |
| 1115 [ |       reference_pic_width_in_luma_samples | ue(v) |
| |       reference_pic_height_in_luma_samples | ue(v) |
| |     } | |
| 1116 → |     num_dec_pic_size_in_luma_samples_minus1 | ue(v) |
| |     for( i = 0; i <= <br>      num_dec_pic_size_in_luma_samples_minus1;<br>      i++ ) { | |
| 1117 [ |       dec_pic_width_in_luma_samples[ i ] | ue(v) |
| |       dec_pic_height_in_luma_samples[ i ] | ue(v) |
| |     } | |
| |   } | |
| | ... | |
| | } | |

FIG. 11

| | Descriptor |
|---|---|
| profile_tier_level( profileTierPresentFlag, maxNumSubLayersMinus1 ) { | |
|   if( profileTierPresentFlag ) { | |
|     general_profile_idc | u(7) |
|     general_tier_flag | u(1) |
|     general_constraint_info( ) | |
|   } | |
|   general_level_idc | u(8) |
|   if( profileTierPresentFlag ) { | |
|     num_sub_profiles | u(8) |
|     for( i = 0; i < num_sub_profiles; i++ ) | |
|       general_sub_profile_idc[ i ] | u(32) |
|   } | |
|   for( i = 0; i < maxNumSubLayersMinus1; i++ ) | |
|     sublayer_level_present_flag[ i ] | u(1) |
|   while( !byte_aligned( ) ) | |
|     ptl_alignment_zero_bit | f(1) |
|   for( i = 0; i < maxNumSubLayersMinus1; i++ ) | |
|     if( sublayer_level_present_flag[ i ] ) | |
|       sublayer_level_idc[ i ] | u(8) |
| } | |

*FIG. 12*

| general_constraint_info( ) { | Descriptor |
|---|---|
| general_non_packed_constraint_flag | u(1) |
| general_frame_only_constraint_flag | u(1) |
| general_non_projected_constraint_flag | u(1) |
| general_one_picture_only_constraint_flag | u(1) |
| no_lossless_coding_tool_constraint_flag | u(1) |
| no_lossy_coding_tool_constraint_flag | u(1) |
| intra_only_constraint_flag | u(1) |
| max_bitdepth_constraint_idc | u(4) |
| max_chroma_format_constraint_idc | u(2) |
| single_layer_constraint_flag | u(1) |
| all_layers_independent_constraint_flag | u(1) |
| no_ref_pic_resampling_constraint_flag | u(1) |
| no_res_change_in_clvs_constraint_flag | u(1) |
| one_tile_per_pic_constraint_flag | u(1) |
| pic_header_in_slice_header_constraint_flag | u(1) |
| one_slice_per_pic_constraint_flag | u(1) |
| one_subpic_per_pic_constraint_flag | u(1) |
| ... | |
| no_partition_constraints_override_constraint_flag | u(1) |
| no_sao_constraint_flag | u(1) |
| no_alf_constraint_flag | u(1) |
| no_radl_constraint_flag | u(1) |
| no_idr_constraint_flag | u(1) |
| no_cra_constraint_flag | u(1) |
| no_gdr_constraint_flag | u(1) |
| no_aps_constraint_flag | u(1) |
| while( !byte_aligned( ) ) | |
|   gci_alignment_zero_bit | f(1) |
| gci_num_reserved_bytes | u(8) |
| for( i = 0; i < gci_num_reserved_bytes; i++ ) | |
|   gci_reserved_byte[ i ] | u(8) |
| } | |

FIG. 13

| | Descriptor |
|---|---|
| profile_tier_level( profileTierPresentFlag, maxNumSubLayersMinus1 ) { | |
|   if( profileTierPresentFlag ) { | |
|     general_profile_idc | u(7) |
|     general_tier_flag | u(1) |
|     num_available_constraint_flags | u(8) |
|     general_constraint_info( num_available_constraint_flags ) | |
|   } | |
|   general_level_idc | u(8) |
|   if( profileTierPresentFlag ) { | |
|     num_sub_profiles | u(8) |
|     for( i = 0; i < num_sub_profiles; i++ ) | |
|       general_sub_profile_idc[ i ] | u(32) |
|   } | |
|   for( i = 0; i < maxNumSubLayersMinus1; i++ ) | |
|     sublayer_level_present_flag[ i ] | u(1) |
|   while( !byte_aligned( ) ) | |
|     ptl_alignment_zero_bit | f(1) |
|   for( i = 0; i < maxNumSubLayersMinus1; i++ ) | |
|     if( sublayer_level_present_flag[ i ] ) | |
|       sublayer_level_idc[ i ] | u(8) |
| } | |

*FIG. 14A*

| | Descriptor |
|---|---|
| general_constraint_info( num_available_constraint_flags ) { | |
|   count = 0 | |
|   if( count < num_available_constraint_flags ) | |
|     general_non_packed_constraint_flag | u(1) |
|   count++ | |
|   if( count < num_available_constraint_flags ) | |
|     general_frame_only_constraint_flag | u(1) |
|   count++ | |
|   if( count < num_available_constraint_flags ) | |
|     general_non_projected_constraint_flag | u(1) |
|   count++ | |
|   ... | |
|   while( !byte_aligned( ) ) | |
|     gci_alignment_zero_bit | f(1) |
|   gci_num_reserved_bytes | u(8) |
|   for( i = 0; i < gci_num_reserved_bytes; i++ ) | |
|     gci_reserved_byte[ i ] | u(8) |
| } | |

*FIG. 14B*

| | Descriptor |
|---|---|
| general_constraint_info() { | |
|   general_frame_structure_constraint_group_flag | u(1) |
|   high_level_functionality_constraint_group_flag | u(1) |
|   scalability_constraint_group_flag | u(1) |
|   partitioning_constraint_group_flag | u(1) |
|   intra_coding_tool_constraint_group_flag | u(1) |
|   inter_coding_tool_constraint_group_flag | u(1) |
|   transform_constraint_group_flag | u(1) |
|   inloop_filtering_constraint_group_flag | u(1) |
|   ... | |
|   if( general_frame_structure_constraint_group_flag ) { | |
|     general_non_packed_constraint_flag | u(1) |
|     general_frame_only_constraint_flag | u(1) |
|     general_non_projected_constraint_flag | u(1) |
|     general_one_picture_only_constraint_flag | u(1) |
|   } | |

FIG. 15A

Continued from FIG. 15A

| | |
|---|---|
| if( high_level_functionality_constraint_group_flag ) { | |
|   pic_header_in_slice_header_constraint_flag | u(1) |
|   no_radl_constraint_flag | u(1) |
|   no_idr_constraint_flag | u(1) |
|   no_cra_constraint_flag | u(1) |
|   no_gdr_constraint_flag | u(1) |
|   no_aps_constraint_flag | u(1) |
|   ... | |
| } | |
| if( intra_coding_tool_constraint_group_flag ) { | |
|   ... | |
| } | |
| if( inter_coding_tool_constraint_group_flag ) { | |
|   ... | |
| } | |
| while( !byte_aligned( ) ) | |
|   gci_alignment_zero_bit | f(1) |
| gci_num_reserved_bytes | u(8) |
| for( i = 0; i < gci_num_reserved_bytes; i++ ) | |
|   gci_reserved_byte[ i ] | u(8) |
| } | |

*FIG. 15B*

| | Descriptor |
|---|---|
| general_constraint_info ( ) { | |
| ... | |
|   gci_num_additional_bits | u(1) |
|   if(gci_num_additional_bits>0) { | u(8) |
|     general_no_extended_precision_constraint_flag | u(1) |
|     general_no_ts_residual_coding_rice_present_in_sh_constraint_flag | u(1) |
|     general_no_rrc_rice_extension_constraint_flag | u(1) |
|     general_no_persistent_rice_adaptation_constraint_flag | u(1) |
|     general_no_reserve_last_sig_coeff_constraint_flag | u(1) |
|     numAdditionalBitsUsed=5 | |
|   } else | |
|     numAdditionalBitsUsed=0 | |
|   for(i=0; i<gci_num_additional_bits-numAdditionalBitsUsed;i++) | |
|     gci_reserved_zero_bit[i] | u(1) |
| } | |

1600

1601 → general_no_extended_precision_constraint_flag
1602 → general_no_ts_residual_coding_rice_present_in_sh_constraint_flag
1603 → general_no_rrc_rice_extension_constraint_flag
1604 → general_no_persistent_rice_adaptation_constraint_flag
1605 → general_no_reserve_last_sig_coeff_constraint_flag

*FIG. 16*

| | Descriptor |
|---|---|
| sps_range_extension ( ) { | |
|   sps_extended_precision_flag | u(1) |
|   if(sps_transform_skip_enabled_flag) | |
|     sps_ts_residual_coding_rice_present_in_sh_flag | u(1) |
|   sps_rrc_rice_extension_flag | u(1) |
|   sps_persistent_rice_adaptation_enabled_flag | u(1) |
|   sps_reverse_last_sig_coeff_enabled_flag | u(1) |
| } | |

1700 ← (table reference)

1701 → sps_extended_precision_flag
1702 → sps_ts_residual_coding_rice_present_in_sh_flag
1703 → sps_rrc_rice_extension_flag
1704 → sps_persistent_rice_adaptation_enabled_flag
1705 → sps_reverse_last_sig_coeff_enabled_flag

FIG. 17

TECHNIQUES FOR CONSTRAINT FLAG SIGNALING FOR RANGE EXTENSION WITH PERSISTENT RICE ADAPTATION

INCORPORATION BY REFERENCE

This present disclosure claims the benefit of priority to U.S. Provisional Application No. 63/250,172, "TECHNIQUES FOR CONSTRAINT FLAG SIGNALING FOR RANGE EXTENSION WITH PERSISTENT RICE ADAPTATION" filed on Sep. 29, 2021. The entire disclosure of the prior application is hereby incorporated by reference in its entirety.

TECHNICAL FIELD

The present disclosure describes embodiments generally related to video coding.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Video coding and decoding can be performed using inter-picture prediction with motion compensation. Uncompressed digital video can include a series of pictures, each picture having a spatial dimension of, for example, 1920×1080 luminance samples and associated chrominance samples. The series of pictures can have a fixed or variable picture rate (informally also known as frame rate), of, for example 60 pictures per second or 60 Hz. Uncompressed video has specific bitrate requirements. For example, 1080p60 4:2:0 video at 8 bit per sample (1920×1080 luminance sample resolution at 60 Hz frame rate) requires close to 1.5 Gbit/s bandwidth. An hour of such video requires more than 600 GBytes of storage space.

One purpose of video coding and decoding can be the reduction of redundancy in the input video signal, through compression. Compression can help reduce the aforementioned bandwidth and/or storage space requirements, in some cases by two orders of magnitude or more. Both lossless compression and lossy compression, as well as a combination thereof can be employed. Lossless compression refers to techniques where an exact copy of the original signal can be reconstructed from the compressed original signal. When using lossy compression, the reconstructed signal may not be identical to the original signal, but the distortion between original and reconstructed signals is small enough to make the reconstructed signal useful for the intended application. In the case of video, lossy compression is widely employed. The amount of distortion tolerated depends on the application; for example, users of certain consumer streaming applications may tolerate higher distortion than users of television distribution applications. The compression ratio achievable can reflect that: higher allowable/tolerable distortion can yield higher compression ratios.

A video encoder and decoder can utilize techniques from several broad categories, including, for example, motion compensation, transform, quantization, and entropy coding.

Video codec technologies can include techniques known as intra coding. In intra coding, sample values are represented without reference to samples or other data from previously reconstructed reference pictures. In some video codecs, the picture is spatially subdivided into blocks of samples. When all blocks of samples are coded in intra mode, that picture can be an intra picture. Intra pictures and their derivations such as independent decoder refresh pictures, can be used to reset the decoder state and can, therefore, be used as the first picture in a coded video bitstream and a video session, or as a still image. The samples of an intra block can be exposed to a transform, and the transform coefficients can be quantized before entropy coding. Intra prediction can be a technique that minimizes sample values in the pre-transform domain. In some cases, the smaller the DC value after a transform is, and the smaller the AC coefficients are, the fewer the bits that are required at a given quantization step size to represent the block after entropy coding.

Traditional intra coding such as known from, for example MPEG-2 generation coding technologies, does not use intra prediction. However, some newer video compression technologies include techniques that attempt, from, for example, surrounding sample data and/or metadata obtained during the encoding/decoding of spatially neighboring, and preceding in decoding order, blocks of data. Such techniques are henceforth called "intra prediction" techniques. Note that in at least some cases, intra prediction is using reference data only from the current picture under reconstruction and not from reference pictures.

There can be many different forms of intra prediction. When more than one of such techniques can be used in a given video coding technology, the technique in use can be coded in an intra prediction mode. In certain cases, modes can have submodes and/or parameters, and those can be coded individually or included in the mode codeword. Which codeword to use for a given mode/submode/parameter combination can have an impact in the coding efficiency gain through intra prediction, and so can the entropy coding technology used to translate the codewords into a bitstream.

A certain mode of intra prediction was introduced with H.264, refined in H.265, and further refined in newer coding technologies such as joint exploration model (JEM), versatile video coding (VVC), and benchmark set (BMS). A predictor block can be formed using neighboring sample values belonging to already available samples. Sample values of neighboring samples are copied into the predictor block according to a direction. A reference to the direction in use can be coded in the bitstream or may itself be predicted.

Referring to FIG. 1A, depicted in the lower right is a subset of nine predictor directions known from H.265's 33 possible predictor directions (corresponding to the 33 angular modes of the 35 intra modes). The point where the arrows converge (101) represents the sample being predicted. The arrows represent the direction from which the sample is being predicted. For example, arrow (102) indicates that sample (101) is predicted from a sample or samples to the upper right, at a 45 degree angle from the horizontal. Similarly, arrow (103) indicates that sample (101) is predicted from a sample or samples to the lower left of sample (101), in a 22.5 degree angle from the horizontal.

Still referring to FIG. 1A, on the top left there is depicted a square block (104) of 4×4 samples (indicated by a dashed, boldface line). The square block (104) includes 16 samples, each labelled with an "S", its position in the Y dimension (e.g., row index) and its position in the X dimension (e.g., column index). For example, sample S21 is the second sample in the Y dimension (from the top) and the first (from the left) sample in the X dimension. Similarly, sample S44 is the fourth sample in block (104) in both the Y and X dimensions. As the block is 4×4 samples in size, S44 is at the bottom right. Further shown are reference samples that follow a similar numbering scheme. A reference sample is labelled with an R, its Y position (e.g., row index) and X position (column index) relative to block (104). In both H.264 and H.265, prediction samples neighbor the block under reconstruction; therefore no negative values need to be used.

Intra picture prediction can work by copying reference sample values from the neighboring samples as appropriated by the signaled prediction direction. For example, assume the coded video bitstream includes signaling that, for this block, indicates a prediction direction consistent with arrow (102)—that is, samples are predicted from a prediction sample or samples to the upper right, at a 45 degree angle from the horizontal. In that case, samples S41, S32, S23, and S14 are predicted from the same reference sample R05. Sample S44 is then predicted from reference sample R08.

In certain cases, the values of multiple reference samples may be combined, for example through interpolation, in order to calculate a reference sample; especially when the directions are not evenly divisible by 45 degrees.

The number of possible directions has increased as video coding technology has developed. In H.264 (year 2003), nine different directions could be represented. That increased to 33 in H.265 (year 2013), and JEM/VVC/BMS, at the time of disclosure, can support up to 65 directions. Experiments have been conducted to identify the most likely directions, and certain techniques in the entropy coding are used to represent those likely directions in a small number of bits, accepting a certain penalty for less likely directions. Further, the directions themselves can sometimes be predicted from neighboring directions used in neighboring, already decoded, blocks.

FIG. 1B shows a schematic (180) that depicts 65 intra prediction directions according to JEM to illustrate the increasing number of prediction directions over time.

The mapping of intra prediction directions bits in the coded video bitstream that represent the direction can be different from video coding technology to video coding technology; and can range, for example, from simple direct mappings of prediction direction to intra prediction mode, to codewords, to complex adaptive schemes involving most probable modes, and similar techniques. In all cases, however, there can be certain directions that are statistically less likely to occur in video content than certain other directions. As the goal of video compression is the reduction of redundancy, those less likely directions will, in a well working video coding technology, be represented by a larger number of bits than more likely directions.

Motion compensation can be a lossy compression technique and can relate to techniques where a block of sample data from a previously reconstructed picture or part thereof (reference picture), after being spatially shifted in a direction indicated by a motion vector (MV henceforth), is used for the prediction of a newly reconstructed picture or picture part. In some cases, the reference picture can be the same as the picture currently under reconstruction. MVs can have two dimensions X and Y, or three dimensions, the third being an indication of the reference picture in use (the latter, indirectly, can be a time dimension).

In some video compression techniques, an MV applicable to a certain area of sample data can be predicted from other MVs, for example from those related to another area of sample data spatially adjacent to the area under reconstruction, and preceding that MV in decoding order. Doing so can substantially reduce the amount of data required for coding the MV, thereby removing redundancy and increasing compression. MV prediction can work effectively, for example, because when coding an input video signal derived from a camera (known as natural video) there is a statistical likelihood that areas larger than the area to which a single MV is applicable move in a similar direction and, therefore, can in some cases be predicted using a similar motion vector derived from MVs of neighboring area. That results in the MV found for a given area to be similar or the same as the MV predicted from the surrounding MVs, and that in turn can be represented, after entropy coding, in a smaller number of bits than what would be used if coding the MV directly. In some cases, MV prediction can be an example of lossless compression of a signal (namely: the MVs) derived from the original signal (namely: the sample stream). In other cases, MV prediction itself can be lossy, for example because of rounding errors when calculating a predictor from several surrounding MVs.

Various MV prediction mechanisms are described in H.265/HEVC (ITU-T Rec. H.265, "High Efficiency Video Coding", December 2016). Out of the many MV prediction mechanisms that H.265 offers, described here is a technique henceforth referred to as "spatial merge".

Referring to FIG. 2, a current block (201) comprises samples that have been found by the encoder during the motion search process to be predictable from a previous block of the same size that has been spatially shifted. Instead of coding that MV directly, the MV can be derived from metadata associated with one or more reference pictures, for example from the most recent (in decoding order) reference picture, using the MV associated with either one of five surrounding samples, denoted A0, A1, and B0, B1, B2 (202 through 206, respectively). In H.265, the MV prediction can use predictors from the same reference picture that the neighboring block is using.

SUMMARY

Aspects of the disclosure provide methods and apparatuses for video data processing. In some examples, an apparatus for video data processing includes processing circuitry. For example, the processing circuitry determines a first syntax element for coding control in a first scope of coded video data in a bitstream. The first syntax element is associated with a coding tool of persistent Rice adaptation defined in a range extension of a video standard for a statistics based Rice parameter derivation in a residual coding. In response to the first syntax element being a first value indicative of disabling of the coding tool in the first scope, the processing circuitry decodes the first scope of coded video data that includes one or more second scopes of coded video data without invoking the coding tool.

In some embodiments, the first syntax element is in general constraint information for coding control of pictures in an output layer set for the decoder. In some examples, the first value of the first syntax element is indicative of disabling the coding tool in each coded layer video sequence (CLVS) in the output layer set. In some examples, the processing circuitry constrains a second syntax element for coding control of a coded layer video sequence (CLVS) in the bitstream to have a value indicative of no invoking of the coding tool for decoding the CLVS.

In some embodiments, in response to the first syntax element being a second value, the processing circuitry determines a value of a second syntax element for coding control of a coded layer video sequence (CLVS) in the bitstream. The second syntax element is indicative of a use/no use of the coding tool in the CLVS. In an example, the processing circuitry infers, in response to the second syntax element not presenting in a sequence parameter set (SPS) for the CLVS, the value of the second syntax element for indicating a no use of the coding tool in the CLVS.

In some examples, in response to the value of the second syntax element being indicative of a use of the coding tool in the CLVS, the processing circuitry determines statistics of coefficients decoded from one or more transform units prior to a current transform unit. The statistics are used to determine an initial value of the Rice parameter for the current transform unit. Then, coefficients of the current transform unit are decoded based on the Rice parameter.

In some embodiments, the processing circuitry decodes the first syntax element from a syntax structure for general constraint information in response to a syntax element in the syntax structure indicating additional bits for general constraint information in the syntax structure.

Aspects of the disclosure also provide a non-transitory computer-readable medium storing instructions which when executed by a computer for video decoding cause the computer to perform the methods for video decoding.

BRIEF DESCRIPTION OF THE DRAWINGS

Further features, the nature, and various advantages of the disclosed subject matter will be more apparent from the following detailed description and the accompanying drawings in which:

FIG. 10 shows an example of a Table (1000) for mapping of upsample or downsample factors, codewords, and Ext-Golomb codes.

FIG. 11 shows some examples of ARC parameters signaling according to some embodiments of the disclosure.

FIG. 12 shows a syntax structure example of a set of PTL syntax elements in some examples.

FIG. 13 shows a syntax structure example of general constraint information in some examples.

FIGS. 14A-14B show examples of PTL information that includes a PTL syntax structure and a general constraint information syntax structure according to some embodiments of the disclosure.

FIGS. 15A-15B show an example of a general constraint information syntax structure according to an embodiment of the disclosure.

FIG. 16 shows a syntax structure of general constraint information according to some embodiments of the disclosure.

FIG. 17 shows a syntax structure example of sequence parameter set (SPS) range extension according to some embodiments of the disclosure.

DETAILED DESCRIPTION OF EMBODIMENTS

Figure 1A:
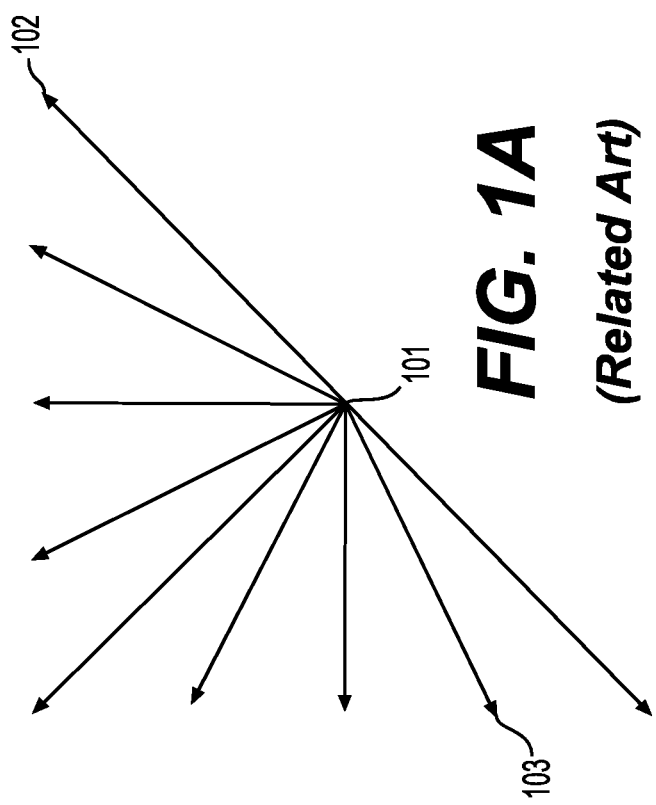
FIG. 1A is a schematic illustration of an exemplary subset of intra prediction modes.
Figure 1B:
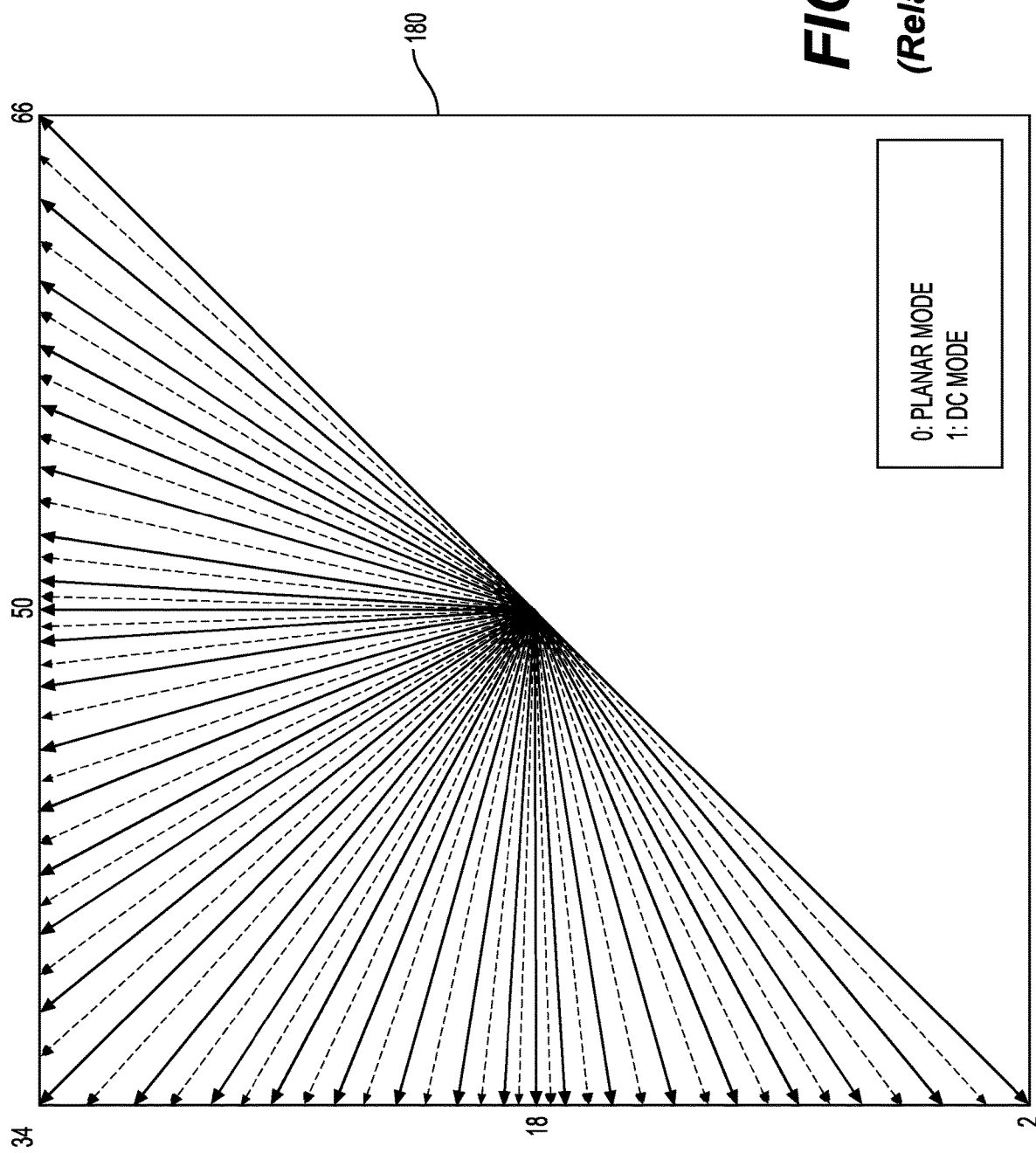
FIG. 1B is an illustration of exemplary intra prediction directions.
Figure 2:
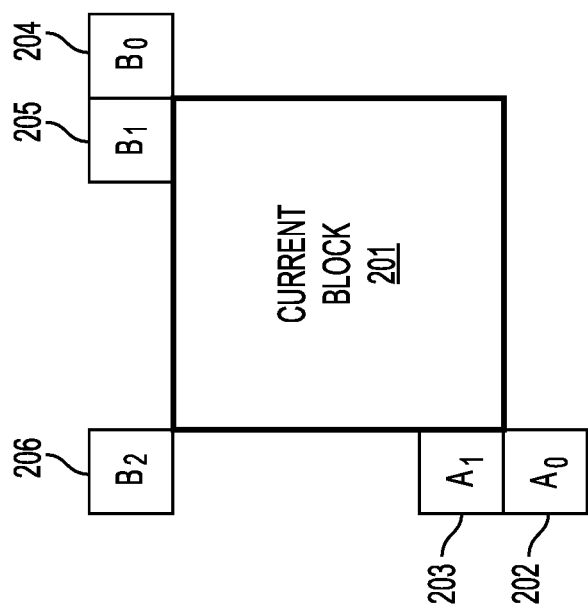
FIG. 2 is a schematic illustration of a current block and its surrounding spatial merge candidates in one example.
Figure 3:
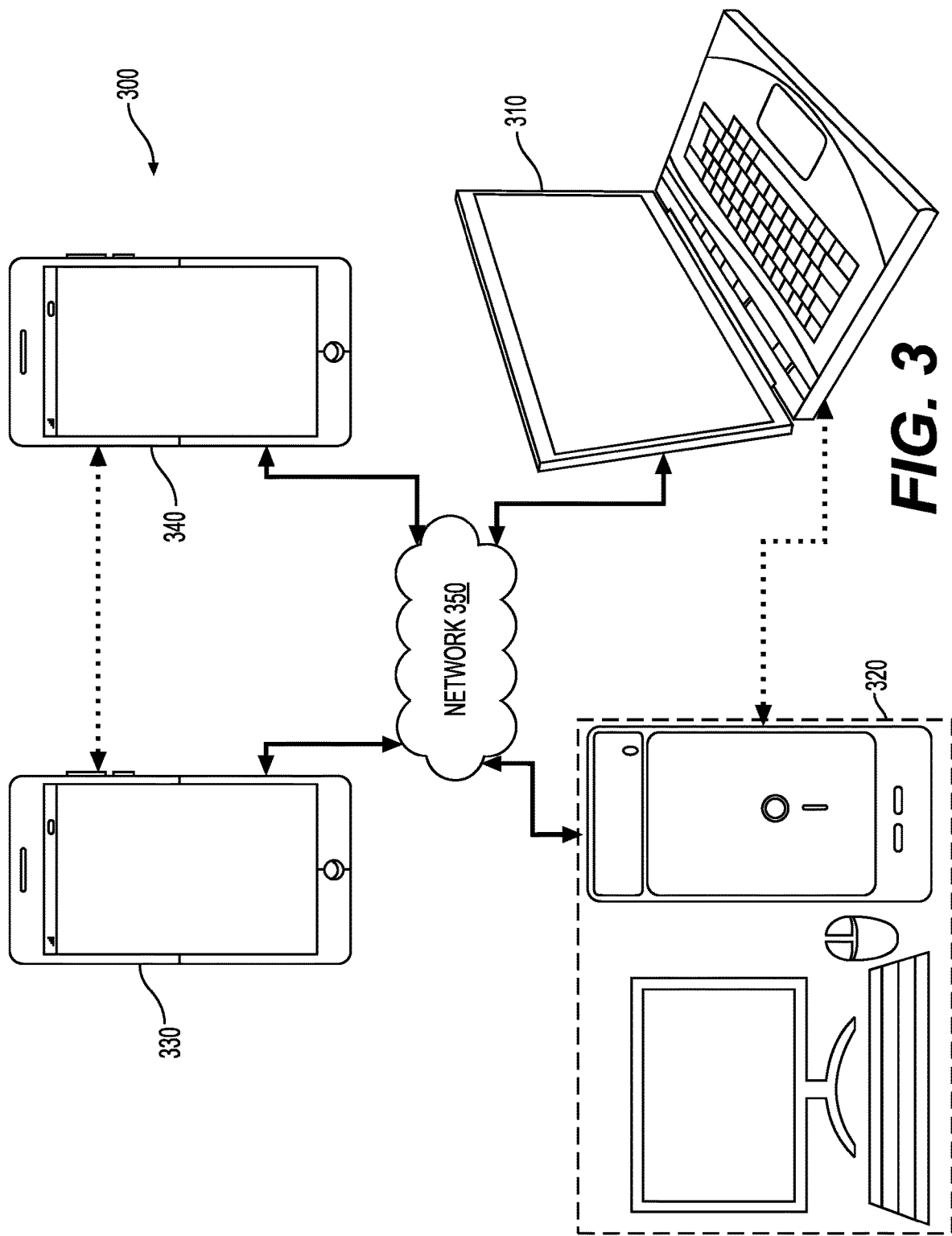
FIG. 3 is a schematic illustration of a simplified block diagram of a communication system (300) in accordance with an embodiment.

FIG. 3 illustrates a simplified block diagram of a communication system (300) according to an embodiment of the present disclosure. The communication system (300) includes a plurality of terminal devices that can communicate with each other, via, for example, a network (350). For example, the communication system (300) includes a first pair of terminal devices (310) and (320) interconnected via the network (350). In the FIG. 3 example, the first pair of terminal devices (310) and (320) performs unidirectional transmission of data. For example, the terminal device (310) may code video data (e.g., a stream of video pictures that are captured by the terminal device (310)) for transmission to the other terminal device (320) via the network (350). The encoded video data can be transmitted in the form of one or more coded video bitstreams. The terminal device (320) may receive the coded video data from the network (350), decode the coded video data to recover the video pictures and display video pictures according to the recovered video data. Unidirectional data transmission may be common in media serving applications and the like.

In another example, the communication system (300) includes a second pair of terminal devices (330) and (340) that performs bidirectional transmission of coded video data that may occur, for example, during videoconferencing. For bidirectional transmission of data, in an example, each terminal device of the terminal devices (330) and (340) may code video data (e.g., a stream of video pictures that are captured by the terminal device) for transmission to the other terminal device of the terminal devices (330) and (340) via the network (350). Each terminal device of the terminal devices (330) and (340) also may receive the coded video data transmitted by the other terminal device of the terminal devices (330) and (340), and may decode the coded video data to recover the video pictures and may display video pictures at an accessible display device according to the recovered video data.

In the FIG. 3 example, the terminal devices (310), (320), (330) and (340) may be illustrated as servers, personal computers and smart phones but the principles of the present disclosure may be not so limited. Embodiments of the present disclosure find application with laptop computers, tablet computers, media players and/or dedicated video conferencing equipment. The network (350) represents any number of networks that convey coded video data among the terminal devices (310), (320), (330) and (340), including for example wireline (wired) and/or wireless communication networks. The communication network (350) may exchange data in circuit-switched and/or packet-switched channels. Representative networks include telecommunications networks, local area networks, wide area networks and/or the Internet. For the purposes of the present discussion, the architecture and topology of the network (350) may be immaterial to the operation of the present disclosure unless explained herein below.

Figure 4:
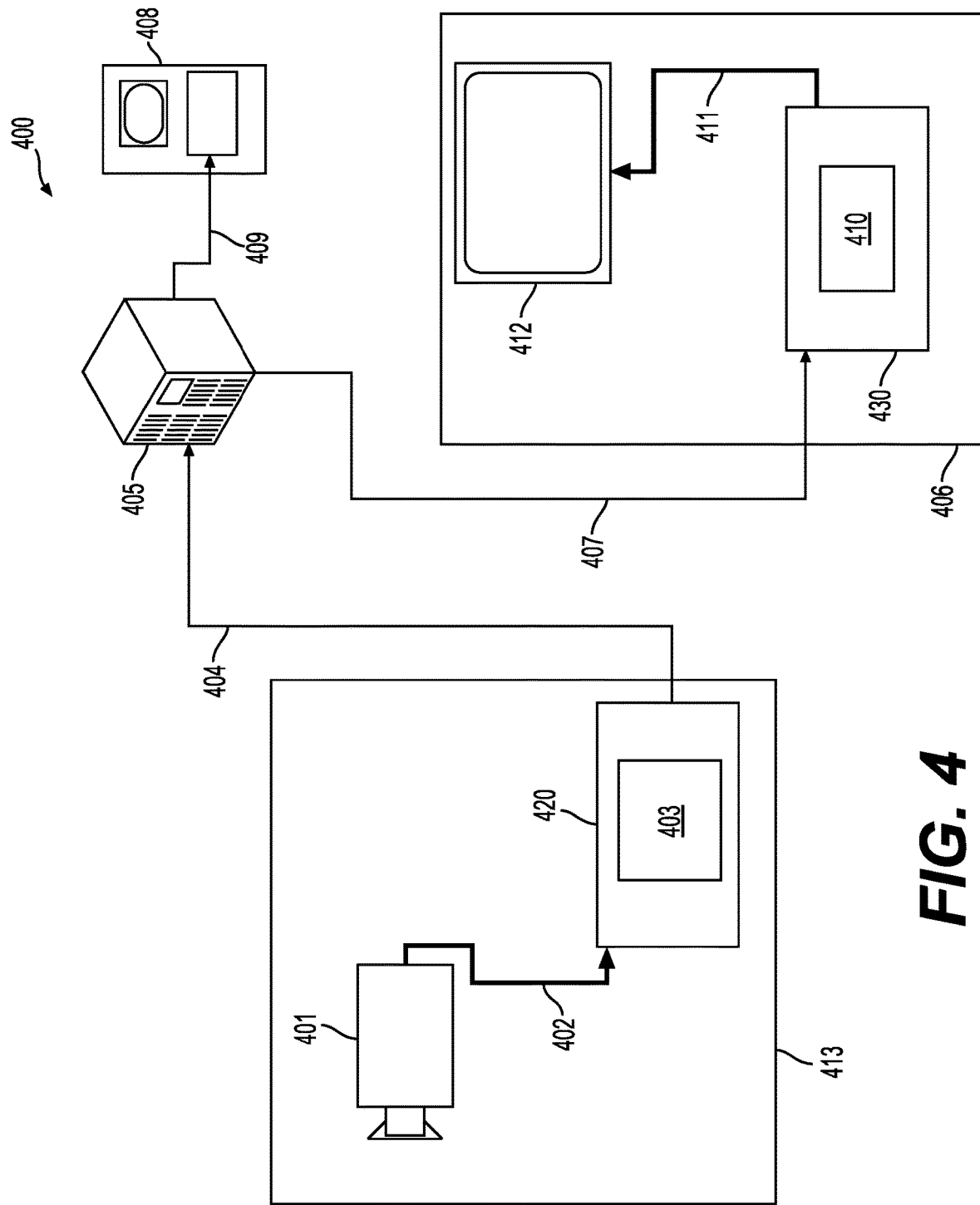
FIG. 4 is a schematic illustration of a simplified block diagram of a communication system (400) in accordance with an embodiment.

FIG. 4 illustrates, as an example for an application for the disclosed subject matter, the placement of a video encoder and a video decoder in a streaming environment. The disclosed subject matter can be equally applicable to other video enabled applications, including, for example, video conferencing, digital TV, storing of compressed video on digital media including CD, DVD, memory stick and the like, and so on.

A streaming system may include a capture subsystem (413), that can include a video source (401), for example a digital camera, creating for example a stream of video pictures (402) that are uncompressed. In an example, the stream of video pictures (402) includes samples that are taken by the digital camera. The stream of video pictures (402), depicted as a bold line to emphasize a high data volume when compared to encoded video data (404) (or coded video bitstreams), can be processed by an electronic device (420) that includes a video encoder (403) coupled to the video source (401). The video encoder (403) can include hardware, software, or a combination thereof to enable or implement aspects of the disclosed subject matter as described in more detail below. The encoded video data (404) (or encoded video bitstream (404)), depicted as a thin line to emphasize the lower data volume when compared to the stream of video pictures (402), can be stored on a streaming server (405) for future use. One or more streaming client subsystems, such as client subsystems (406) and (408) in FIG. 4 can access the streaming server (405) to retrieve copies (407) and (409) of the encoded video data (404). A client subsystem (406) can include a video decoder (410), for example, in an electronic device (430). The video decoder (410) decodes the incoming copy (407) of the encoded video data and creates an outgoing stream of video pictures (411) that can be rendered on a display (412) (e.g., display screen) or other rendering device (not depicted). In some streaming systems, the encoded video data (404), (407), and (409) (e.g., video bitstreams) can be encoded according to certain video coding/compression standards. Examples of those standards include ITU-T Recommendation H.265. In an example, a video coding standard under development is informally known as Versatile Video Coding (VVC). The disclosed subject matter may be used in the context of VVC.

It is noted that the electronic devices (420) and (430) can include other components (not shown). For example, the electronic device (420) can include a video decoder (not shown) and the electronic device (430) can include a video encoder (not shown) as well.

Figure 5:
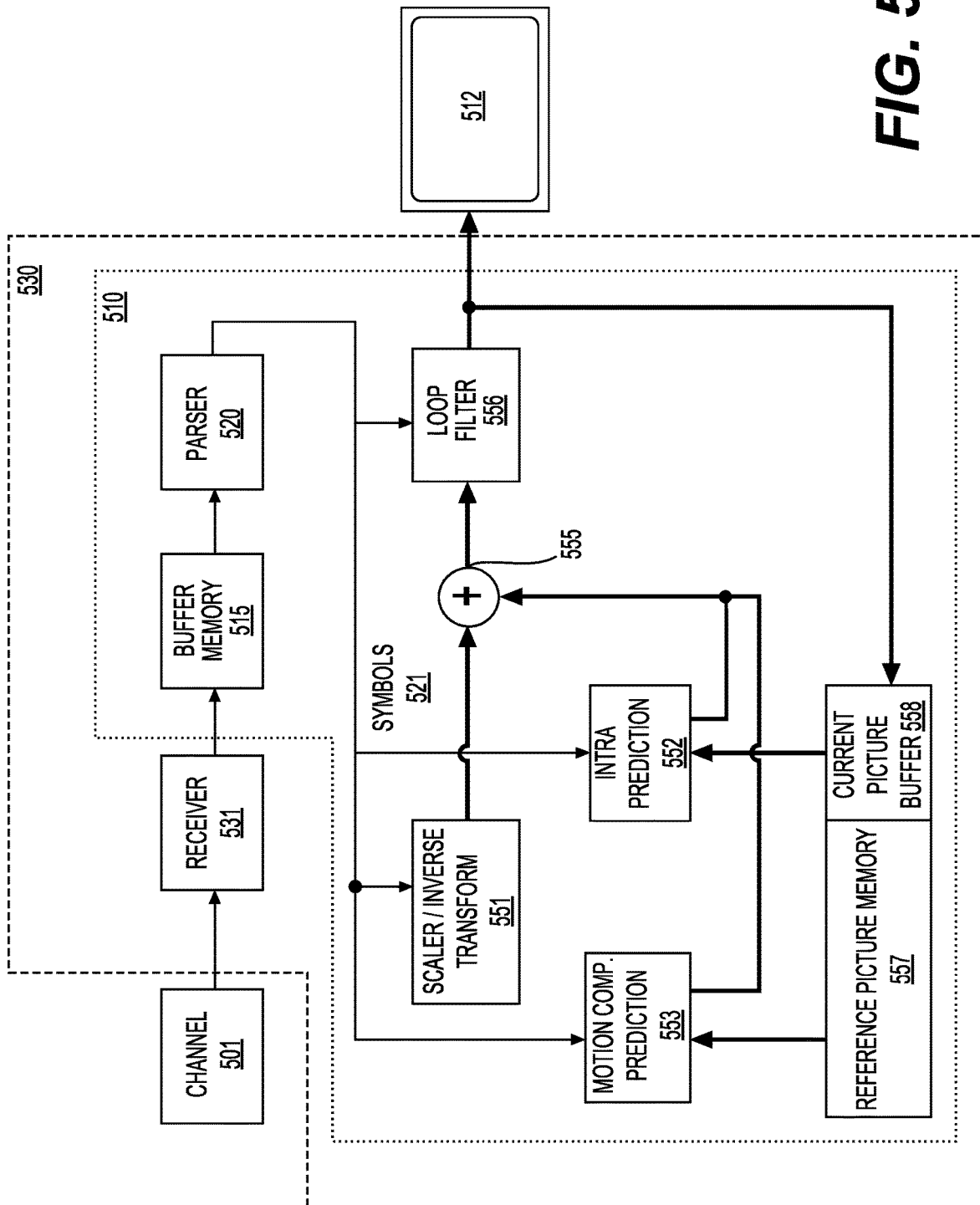
FIG. 5 is a schematic illustration of a simplified block diagram of a decoder in accordance with an embodiment.

FIG. 5 shows a block diagram of a video decoder (510) according to an embodiment of the present disclosure. The video decoder (510) can be included in an electronic device (530). The electronic device (530) can include a receiver (531) (e.g., receiving circuitry). The video decoder (510) can be used in the place of the video decoder (410) in the FIG. 4 example.

The receiver (531) may receive one or more coded video sequences to be decoded by the video decoder (510); in the same or another embodiment, one coded video sequence at a time, where the decoding of each coded video sequence is independent from other coded video sequences. The coded video sequence may be received from a channel (501), which may be a hardware/software link to a storage device which stores the encoded video data. The receiver (531) may receive the encoded video data with other data, for example, coded audio data and/or ancillary data streams, that may be forwarded to their respective using entities (not depicted). The receiver (531) may separate the coded video sequence from the other data. To combat network jitter, a buffer memory (515) may be coupled in between the receiver (531) and an entropy decoder/parser (520) ("parser (520)" henceforth). In certain applications, the buffer memory (515) is part of the video decoder (510). In others, it can be outside of the video decoder (510) (not depicted). In still others, there can be a buffer memory (not depicted) outside of the video decoder (510), for example to combat network jitter, and in addition another buffer memory (515) inside the video decoder (510), for example to handle playout timing. When the receiver (531) is receiving data from a store/forward device of sufficient bandwidth and controllability, or from an isosynchronous network, the buffer memory (515) may not be needed, or can be small. For use on best effort packet networks such as the Internet, the buffer memory (515) may be required, can be comparatively large and can be advantageously of adaptive size, and may at least partially be implemented in an operating system or similar elements (not depicted) outside of the video decoder (510).

The video decoder (510) may include the parser (520) to reconstruct symbols (521) from the coded video sequence. Categories of those symbols include information used to manage operation of the video decoder (510), and potentially information to control a rendering device such as a render device (512) (e.g., a display screen) that is not an integral part of the electronic device (530) but can be coupled to the electronic device (530), as was shown in FIG. 5. The control information for the rendering device(s) may be in the form of Supplemental Enhancement Information (SEI messages) or Video Usability Information (VUI) parameter set fragments (not depicted). The parser (520) may parse/entropy-decode the coded video sequence that is received. The coding of the coded video sequence can be in accordance with a video coding technology or standard, and can follow various principles, including variable length coding, Huffman coding, arithmetic coding with or without context sensitivity, and so forth. The parser (520) may extract from the coded video sequence, a set of subgroup parameters for at least one of the subgroups of pixels in the video decoder, based upon at least one parameter corresponding to the group. Subgroups can include Groups of Pictures (GOPs), pictures, tiles, slices, macroblocks, Coding Units (CUs), blocks, Transform Units (TUs), Prediction Units (PUs) and so forth. The parser (520) may also extract from the coded video sequence information such as transform coefficients, quantizer parameter values, motion vectors, and so forth.

The parser (520) may perform an entropy decoding/parsing operation on the video sequence received from the buffer memory (515), so as to create symbols (521).

Reconstruction of the symbols (521) can involve multiple different units depending on the type of the coded video picture or parts thereof (such as: inter and intra picture, inter and intra block), and other factors. Which units are involved, and how, can be controlled by the subgroup control information that was parsed from the coded video sequence by the parser (520). The flow of such subgroup control information between the parser (520) and the multiple units below is not depicted for clarity.

Beyond the functional blocks already mentioned, the video decoder (510) can be conceptually subdivided into a number of functional units as described below. In a practical implementation operating under commercial constraints, many of these units interact closely with each other and can, at least partly, be integrated into each other. However, for the purpose of describing the disclosed subject matter, the conceptual subdivision into the functional units below is appropriate.

A first unit is the scaler/inverse transform unit (551). The scaler/inverse transform unit (551) receives a quantized transform coefficient as well as control information, including which transform to use, block size, quantization factor, quantization scaling matrices, etc. as symbol(s) (521) from the parser (520). The scaler/inverse transform unit (551) can output blocks comprising sample values, that can be input into aggregator (555).

In some cases, the output samples of the scaler/inverse transform (551) can pertain to an intra coded block; that is: a block that is not using predictive information from previously reconstructed pictures, but can use predictive information from previously reconstructed parts of the current picture. Such predictive information can be provided by an intra picture prediction unit (552). In some cases, the intra picture prediction unit (552) generates a block of the same size and shape of the block under reconstruction, using surrounding already reconstructed information fetched from the current picture buffer (558). The current picture buffer (558) buffers, for example, partly reconstructed current picture and/or fully reconstructed current picture. The aggregator (555), in some cases, adds, on a per sample basis, the prediction information the intra prediction unit (552) has generated to the output sample information as provided by the scaler/inverse transform unit (551).

In other cases, the output samples of the scaler/inverse transform unit (551) can pertain to an inter coded, and potentially motion compensated block. In such a case, a motion compensation prediction unit (553) can access reference picture memory (557) to fetch samples used for prediction. After motion compensating the fetched samples in accordance with the symbols (521) pertaining to the block, these samples can be added by the aggregator (555) to the output of the scaler/inverse transform unit (551) (in this case called the residual samples or residual signal) so as to generate output sample information. The addresses within the reference picture memory (557) from where the motion compensation prediction unit (553) fetches prediction samples can be controlled by motion vectors, available to the motion compensation prediction unit (553) in the form of symbols (521) that can have, for example X, Y, and reference picture components. Motion compensation also can include interpolation of sample values as fetched from the reference picture memory (557) when sub-sample exact motion vectors are in use, motion vector prediction mechanisms, and so forth.

The output samples of the aggregator (555) can be subject to various loop filtering techniques in the loop filter unit (556). Video compression technologies can include in-loop filter technologies that are controlled by parameters included in the coded video sequence (also referred to as coded video bitstream) and made available to the loop filter unit (556) as symbols (521) from the parser (520), but can also be responsive to meta-information obtained during the decoding of previous (in decoding order) parts of the coded picture or coded video sequence, as well as responsive to previously reconstructed and loop-filtered sample values.

The output of the loop filter unit (556) can be a sample stream that can be output to the render device (512) as well as stored in the reference picture memory (557) for use in future inter-picture prediction.

Certain coded pictures, once fully reconstructed, can be used as reference pictures for future prediction. For example, once a coded picture corresponding to a current picture is fully reconstructed and the coded picture has been identified as a reference picture (by, for example, the parser (520)), the current picture buffer (558) can become a part of the reference picture memory (557), and a fresh current picture buffer can be reallocated before commencing the reconstruction of the following coded picture.

The video decoder (510) may perform decoding operations according to a predetermined video compression technology in a standard, such as ITU-T Rec. H.265. The coded video sequence may conform to a syntax specified by the video compression technology or standard being used, in the sense that the coded video sequence adheres to both the syntax of the video compression technology or standard and the profiles as documented in the video compression technology or standard. Specifically, a profile can select certain tools as the only tools available for use under that profile from all the tools available in the video compression technology or standard. Also necessary for compliance can be that the complexity of the coded video sequence is within bounds as defined by the level of the video compression technology or standard. In some cases, levels restrict the maximum picture size, maximum frame rate, maximum reconstruction sample rate (measured in, for example megasamples per second), maximum reference picture size, and so on. Limits set by levels can, in some cases, be further restricted through Hypothetical Reference Decoder (HRD) specifications and metadata for HRD buffer management signaled in the coded video sequence.

In an embodiment, the receiver (531) may receive additional (redundant) data with the encoded video. The additional data may be included as part of the coded video sequence(s). The additional data may be used by the video decoder (510) to properly decode the data and/or to more accurately reconstruct the original video data. Additional data can be in the form of, for example, temporal, spatial, or signal noise ratio (SNR) enhancement layers, redundant slices, redundant pictures, forward error correction codes, and so on.

Figure 6:
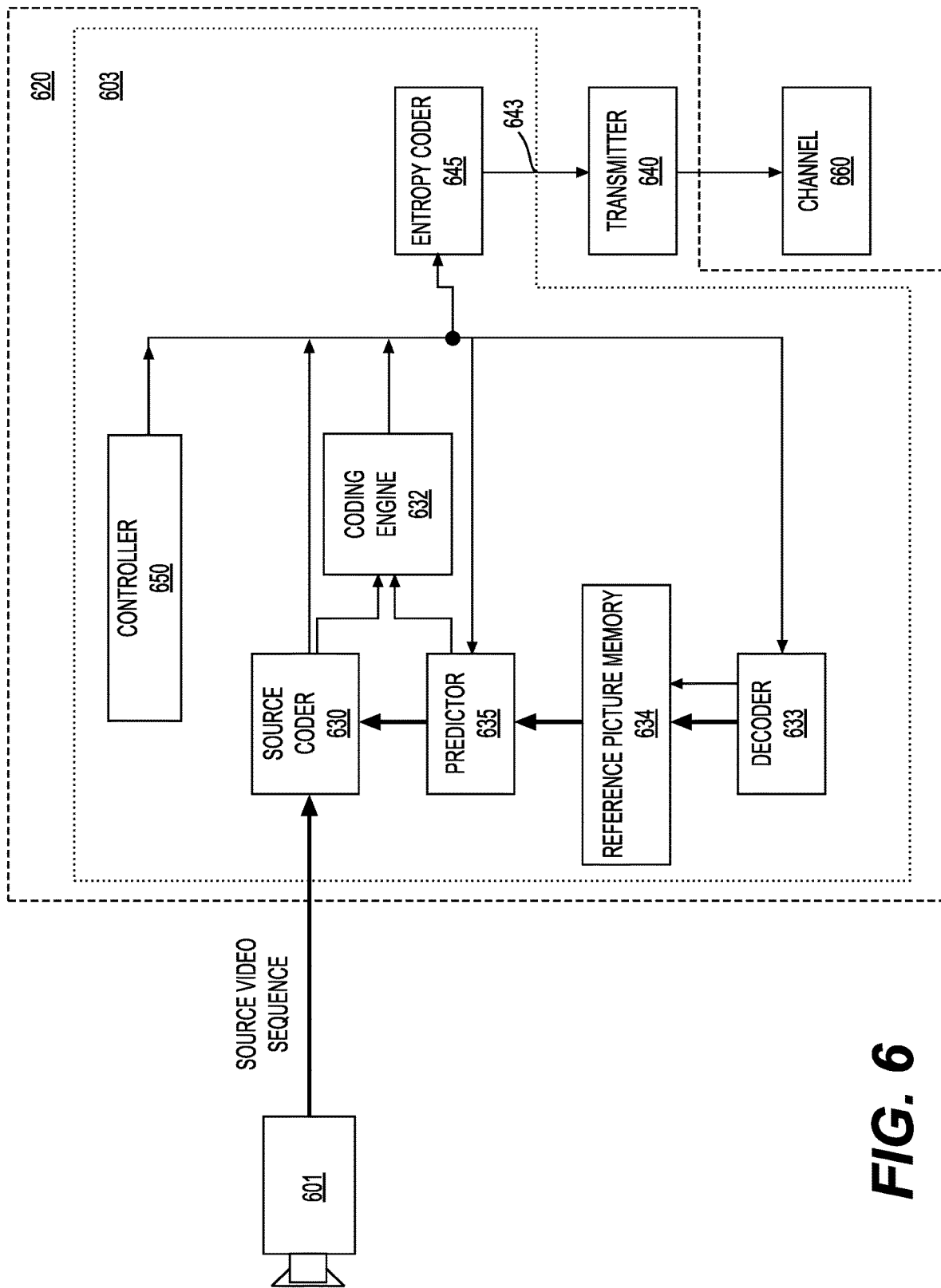
FIG. 6 is a schematic illustration of a simplified block diagram of an encoder in accordance with an embodiment.

FIG. 6 shows a block diagram of a video encoder (603) according to an embodiment of the present disclosure. The video encoder (603) is included in an electronic device (620). The electronic device (620) includes a transmitter (640) (e.g., transmitting circuitry). The video encoder (603) can be used in the place of the video encoder (403) in the FIG. 4 example.

The video encoder (603) may receive video samples from a video source (601) (that is not part of the electronic device (620) in the FIG. 6 example) that may capture video image(s) to be coded by the video encoder (603). In another example, the video source (601) is a part of the electronic device (620).

The video source (601) may provide the source video sequence to be coded by the video encoder (603) in the form of a digital video sample stream that can be of any suitable bit depth (for example: 8 bit, 10 bit, 12 bit, . . . ), any colorspace (for example, BT.601 Y CrCB, RGB, . . . ), and any suitable sampling structure (for example Y CrCb 4:2:0, Y CrCb 4:4:4). In a media serving system, the video source (601) may be a storage device storing previously prepared video. In a videoconferencing system, the video source (601) may be a camera that captures local image information as a video sequence. Video data may be provided as a plurality of individual pictures that impart motion when viewed in sequence. The pictures themselves may be organized as a spatial array of pixels, wherein each pixel can comprise one or more samples depending on the sampling structure, color space, etc. in use. A person skilled in the art can readily understand the relationship between pixels and samples. The description below focuses on samples.

According to an embodiment, the video encoder (603) may code and compress the pictures of the source video sequence into a coded video sequence (643) in real time or under any other time constraints as required by the application. Enforcing appropriate coding speed is one function of a controller (650). In some embodiments, the controller (650) controls other functional units as described below and is functionally coupled to the other functional units. The coupling is not depicted for clarity. Parameters set by the controller (650) can include rate control related parameters (picture skip, quantizer, lambda value of rate-distortion optimization techniques, . . . ), picture size, group of pictures (GOP) layout, maximum motion vector search range, and so forth. The controller (650) can be configured to have other suitable functions that pertain to the video encoder (603) optimized for a certain system design.

In some embodiments, the video encoder (603) is configured to operate in a coding loop. As an oversimplified description, in an example, the coding loop can include a source coder (630) (e.g., responsible for creating symbols, such as a symbol stream, based on an input picture to be coded, and a reference picture(s)), and a (local) decoder (633) embedded in the video encoder (603). The decoder (633) reconstructs the symbols to create the sample data in a similar manner as a (remote) decoder also would create (as any compression between symbols and coded video bitstream is lossless in the video compression technologies considered in the disclosed subject matter). The reconstructed sample stream (sample data) is input to the reference picture memory (634). As the decoding of a symbol stream leads to bit-exact results independent of decoder location (local or remote), the content in the reference picture memory (634) is also bit exact between the local encoder and remote encoder. In other words, the prediction part of an encoder "sees" as reference picture samples exactly the same sample values as a decoder would "see" when using prediction during decoding. This fundamental principle of reference picture synchronicity (and resulting drift, if synchronicity cannot be maintained, for example because of channel errors) is used in some related arts as well.

The operation of the "local" decoder (633) can be the same as of a "remote" decoder, such as the video decoder (510), which has already been described in detail above in conjunction with FIG. 5. Briefly referring also to FIG. 5, however, as symbols are available and encoding/decoding of symbols to a coded video sequence by an entropy coder (645) and the parser (520) can be lossless, the entropy decoding parts of the video decoder (510), including the buffer memory (515), and parser (520) may not be fully implemented in the local decoder (633).

An observation that can be made at this point is that any decoder technology except the parsing/entropy decoding that is present in a decoder also necessarily needs to be present, in substantially identical functional form, in a corresponding encoder. For this reason, the disclosed subject matter focuses on decoder operation. The description of encoder technologies can be abbreviated as they are the inverse of the comprehensively described decoder technologies. Only in certain areas a more detail description is required and provided below.

During operation, in some examples, the source coder (630) may perform motion compensated predictive coding, which codes an input picture predictively with reference to one or more previously coded picture from the video sequence that were designated as "reference pictures." In this manner, the coding engine (632) codes differences between pixel blocks of an input picture and pixel blocks of reference picture(s) that may be selected as prediction reference(s) to the input picture.

The local video decoder (633) may decode coded video data of pictures that may be designated as reference pictures, based on symbols created by the source coder (630). Operations of the coding engine (632) may advantageously be lossy processes. When the coded video data may be decoded at a video decoder (not shown in FIG. 6), the reconstructed video sequence typically may be a replica of the source video sequence with some errors. The local video decoder (633) replicates decoding processes that may be performed by the video decoder on reference pictures and may cause reconstructed reference pictures to be stored in the reference picture cache (634). In this manner, the video encoder (603) may store copies of reconstructed reference pictures locally that have common content as the reconstructed reference pictures that will be obtained by a far-end video decoder (absent transmission errors).

The predictor (635) may perform prediction searches for the coding engine (632). That is, for a new picture to be coded, the predictor (635) may search the reference picture memory (634) for sample data (as candidate reference pixel blocks) or certain metadata such as reference picture motion vectors, block shapes, and so on, that may serve as an appropriate prediction reference for the new pictures. The predictor (635) may operate on a sample block-by-pixel block basis to find appropriate prediction references. In some cases, as determined by search results obtained by the predictor (635), an input picture may have prediction references drawn from multiple reference pictures stored in the reference picture memory (634).

The controller (650) may manage coding operations of the source coder (630), including, for example, setting of parameters and subgroup parameters used for encoding the video data.

Output of all aforementioned functional units may be subjected to entropy coding in the entropy coder (645). The entropy coder (645) translates the symbols as generated by the various functional units into a coded video sequence, by lossless compressing the symbols according to technologies such as Huffman coding, variable length coding, arithmetic coding, and so forth.

The transmitter (640) may buffer the coded video sequence(s) as created by the entropy coder (645) to prepare for transmission via a communication channel (660), which may be a hardware/software link to a storage device which would store the encoded video data. The transmitter (640) may merge coded video data from the video coder (603) with other data to be transmitted, for example, coded audio data and/or ancillary data streams (sources not shown).

The controller (650) may manage operation of the video encoder (603). During coding, the controller (650) may assign to each coded picture a certain coded picture type, which may affect the coding techniques that may be applied to the respective picture. For example, pictures often may be assigned as one of the following picture types:

An Intra Picture (I picture) may be one that may be coded and decoded without using any other picture in the sequence as a source of prediction. Some video codecs allow for different types of intra pictures, including, for example Independent Decoder Refresh ("IDR") Pictures. A person skilled in the art is aware of those variants of I pictures and their respective applications and features.

A predictive picture (P picture) may be one that may be coded and decoded using intra prediction or inter prediction using at most one motion vector and reference index to predict the sample values of each block.

A bi-directionally predictive picture (B Picture) may be one that may be coded and decoded using intra prediction or inter prediction using at most two motion vectors and reference indices to predict the sample values of each block. Similarly, multiple-predictive pictures can use more than two reference pictures and associated metadata for the reconstruction of a single block.

Source pictures commonly may be subdivided spatially into a plurality of sample blocks (for example, blocks of 4×4, 8×8, 4×8, or 16×16 samples each) and coded on a block-by-block basis. Blocks may be coded predictively with reference to other (already coded) blocks as determined by the coding assignment applied to the blocks' respective pictures. For example, blocks of I pictures may be coded non-predictively or they may be coded predictively with reference to already coded blocks of the same picture (spatial prediction or intra prediction). Pixel blocks of P pictures may be coded predictively, via spatial prediction or via temporal prediction with reference to one previously coded reference picture. Blocks of B pictures may be coded predictively, via spatial prediction or via temporal prediction with reference to one or two previously coded reference pictures.

The video encoder (603) may perform coding operations according to a predetermined video coding technology or standard, such as ITU-T Rec. H.265. In its operation, the video encoder (603) may perform various compression operations, including predictive coding operations that exploit temporal and spatial redundancies in the input video sequence. The coded video data, therefore, may conform to a syntax specified by the video coding technology or standard being used.

In an embodiment, the transmitter (640) may transmit additional data with the encoded video. The source coder (630) may include such data as part of the coded video sequence. Additional data may comprise temporal/spatial/SNR enhancement layers, other forms of redundant data such as redundant pictures and slices, SEI messages, VUI parameter set fragments, and so on.

A video may be captured as a plurality of source pictures (video pictures) in a temporal sequence. Intra-picture prediction (often abbreviated to intra prediction) makes use of spatial correlation in a given picture, and inter-picture prediction makes uses of the (temporal or other) correlation between the pictures. In an example, a specific picture under encoding/decoding, which is referred to as a current picture, is partitioned into blocks. When a block in the current picture is similar to a reference block in a previously coded and still buffered reference picture in the video, the block in the current picture can be coded by a vector that is referred to as a motion vector. The motion vector points to the reference block in the reference picture, and can have a third dimension identifying the reference picture, in case multiple reference pictures are in use.

In some embodiments, a bi-prediction technique can be used in the inter-picture prediction. According to the bi-prediction technique, two reference pictures, such as a first reference picture and a second reference picture that are both prior in decoding order to the current picture in the video (but may be in the past and future, respectively, in display order) are used. A block in the current picture can be coded by a first motion vector that points to a first reference block in the first reference picture, and a second motion vector that points to a second reference block in the second reference picture. The block can be predicted by a combination of the first reference block and the second reference block.

Further, a merge mode technique can be used in the inter-picture prediction to improve coding efficiency.

According to some embodiments of the disclosure, predictions, such as inter-picture predictions and intra-picture predictions are performed in the unit of blocks. For example, according to the HEVC standard, a picture in a sequence of video pictures is partitioned into coding tree units (CTU) for compression, the CTUs in a picture have the same size, such as 64×64 pixels, 32×32 pixels, or 16×16 pixels. In general, a CTU includes three coding tree blocks (CTBs), which are one luma CTB and two chroma CTBs. Each CTU can be recursively quadtree split into one or multiple coding units (CUs). For example, a CTU of 64×64 pixels can be split into one CU of 64×64 pixels, or 4 CUs of 32×32 pixels, or 16 CUs of 16×16 pixels. In an example, each CU is analyzed to determine a prediction type for the CU, such as an inter prediction type or an intra prediction type. The CU is split into one or more prediction units (PUs) depending on the temporal and/or spatial predictability. Generally, each PU includes a luma prediction block (PB), and two chroma PBs. In an embodiment, a prediction operation in coding (encoding/decoding) is performed in the unit of a prediction block. Using a luma prediction block as an example of a prediction block, the prediction block includes a matrix of values (e.g., luma values) for pixels, such as 8×8 pixels, 16×16 pixels, 8×16 pixels, 16×8 pixels, and the like.

Figure 7:
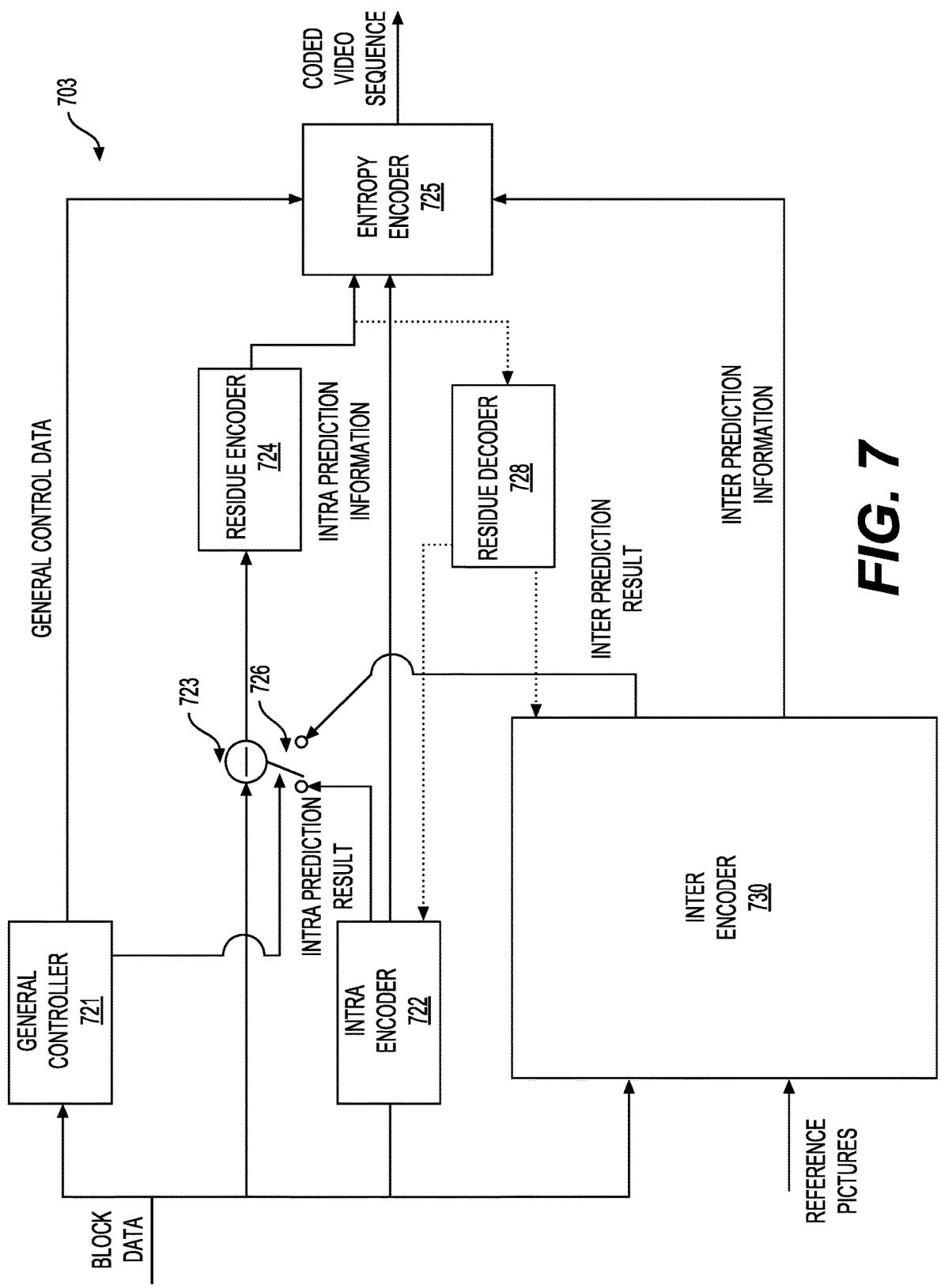
FIG. 7 shows a block diagram of an encoder in accordance with another embodiment.

FIG. 7 shows a diagram of a video encoder (703) according to another embodiment of the disclosure. The video encoder (703) is configured to receive a processing block (e.g., a prediction block) of sample values within a current video picture in a sequence of video pictures, and encode the processing block into a coded picture that is part of a coded video sequence. In an example, the video encoder (703) is used in the place of the video encoder (403) in the FIG. 4 example.

In an HEVC example, the video encoder (703) receives a matrix of sample values for a processing block, such as a prediction block of 8×8 samples, and the like. The video encoder (703) determines whether the processing block is best coded using intra mode, inter mode, or bi-prediction mode using, for example, rate-distortion optimization. When the processing block is to be coded in intra mode, the video encoder (703) may use an intra prediction technique to encode the processing block into the coded picture; and when the processing block is to be coded in inter mode or bi-prediction mode, the video encoder (703) may use an inter prediction or bi-prediction technique, respectively, to encode the processing block into the coded picture. In certain video coding technologies, merge mode can be an inter picture prediction submode where the motion vector is derived from one or more motion vector predictors without the benefit of a coded motion vector component outside the predictors. In certain other video coding technologies, a motion vector component applicable to the subject block may be present. In an example, the video encoder (703) includes other components, such as a mode decision module (not shown) to determine the mode of the processing blocks.

In the FIG. 7 example, the video encoder (703) includes the inter encoder (730), an intra encoder (722), a residue calculator (723), a switch (726), a residue encoder (724), a general controller (721), and an entropy encoder (725) coupled together as shown in FIG. 7.

The inter encoder (730) is configured to receive the samples of the current block (e.g., a processing block), compare the block to one or more reference blocks in reference pictures (e.g., blocks in previous pictures and later pictures), generate inter prediction information (e.g., description of redundant information according to inter encoding technique, motion vectors, merge mode information), and calculate inter prediction results (e.g., predicted block) based on the inter prediction information using any suitable technique. In some examples, the reference pictures are decoded reference pictures that are decoded based on the encoded video information.

The intra encoder (722) is configured to receive the samples of the current block (e.g., a processing block), in some cases compare the block to blocks already coded in the same picture, generate quantized coefficients after transform, and in some cases also intra prediction information (e.g., an intra prediction direction information according to one or more intra encoding techniques). In an example, the intra encoder (722) also calculates intra prediction results (e.g., predicted block) based on the intra prediction information and reference blocks in the same picture.

The general controller (721) is configured to determine general control data and control other components of the video encoder (703) based on the general control data. In an example, the general controller (721) determines the mode of the block, and provides a control signal to the switch (726) based on the mode. For example, when the mode is the intra mode, the general controller (721) controls the switch (726) to select the intra mode result for use by the residue calculator (723), and controls the entropy encoder (725) to select the intra prediction information and include the intra prediction information in the bitstream; and when the mode is the inter mode, the general controller (721) controls the switch (726) to select the inter prediction result for use by the residue calculator (723), and controls the entropy encoder (725) to select the inter prediction information and include the inter prediction information in the bitstream.

The residue calculator (723) is configured to calculate a difference (residue data) between the received block and prediction results selected from the intra encoder (722) or the inter encoder (730). The residue encoder (724) is configured to operate based on the residue data to encode the residue data to generate the transform coefficients. In an example, the residue encoder (724) is configured to convert the residue data from a spatial domain to a frequency domain, and generate the transform coefficients. The transform coefficients are then subject to quantization processing to obtain quantized transform coefficients. In various embodiments, the video encoder (703) also includes a residue decoder (728). The residue decoder (728) is configured to perform inverse-transform, and generate the decoded residue data. The decoded residue data can be suitably used by the intra encoder (722) and the inter encoder (730). For example, the inter encoder (730) can generate decoded blocks based on the decoded residue data and inter prediction information, and the intra encoder (722) can generate decoded blocks based on the decoded residue data and the intra prediction information. The decoded blocks are suitably processed to generate decoded pictures and the decoded pictures can be buffered in a memory circuit (not shown) and used as reference pictures in some examples.

The entropy encoder (725) is configured to format the bitstream to include the encoded block. The entropy encoder (725) is configured to include various information according to a suitable standard, such as the HEVC standard. In an example, the entropy encoder (725) is configured to include the general control data, the selected prediction information (e.g., intra prediction information or inter prediction information), the residue information, and other suitable information in the bitstream. Note that, according to the disclosed subject matter, when coding a block in the merge submode of either inter mode or bi-prediction mode, there is no residue information.

Figure 8:
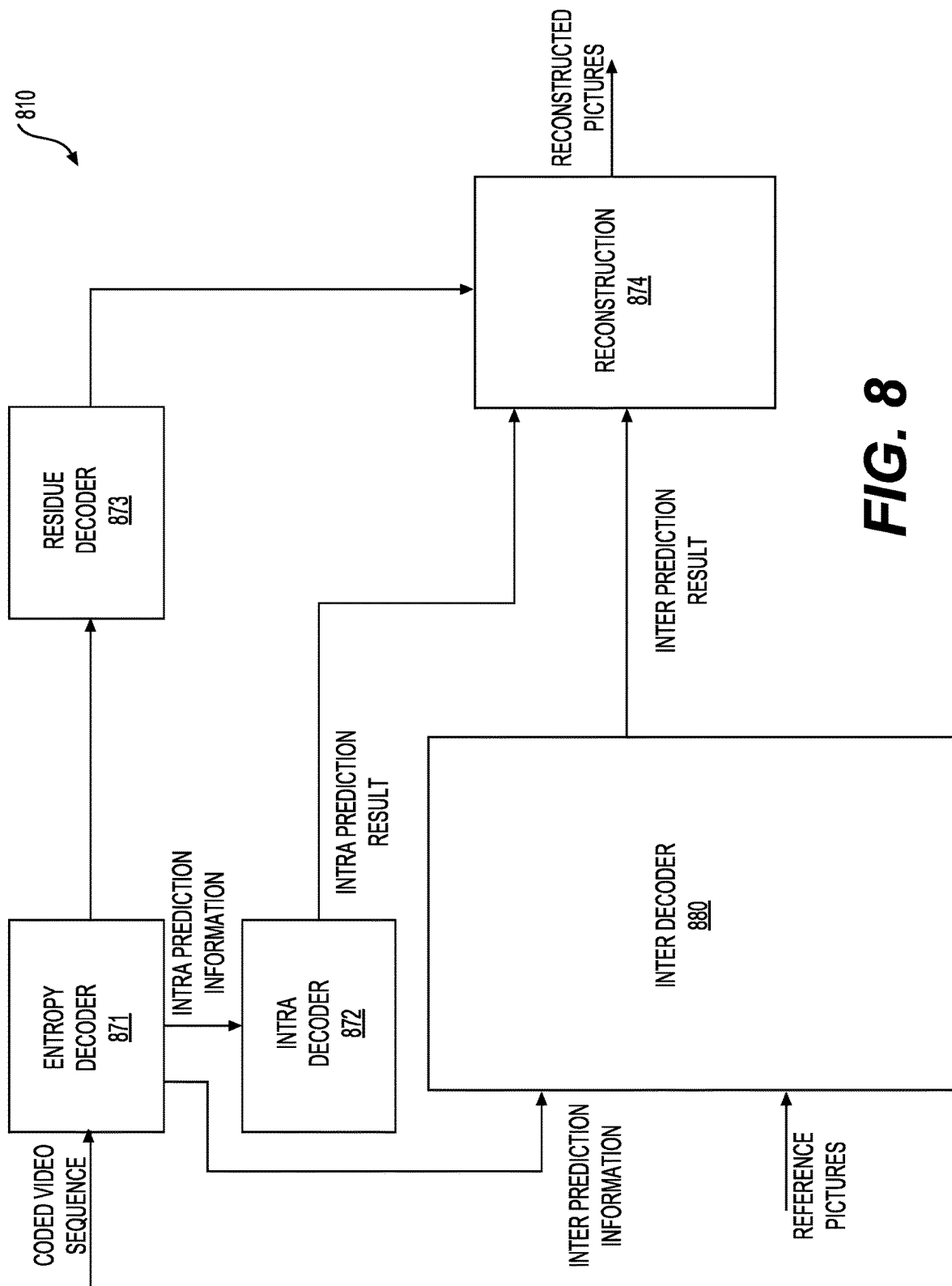
FIG. 8 shows a block diagram of a decoder in accordance with another embodiment.

FIG. 8 shows a diagram of a video decoder (810) according to another embodiment of the disclosure. The video decoder (810) is configured to receive coded pictures that are part of a coded video sequence, and decode the coded pictures to generate reconstructed pictures. In an example, the video decoder (810) is used in the place of the video decoder (410) in the FIG. 4 example.

In the FIG. 8 example, the video decoder (810) includes an entropy decoder (871), an inter decoder (880), a residue decoder (873), a reconstruction module (874), and an intra decoder (872) coupled together as shown in FIG. 8.

The entropy decoder (871) can be configured to reconstruct, from the coded picture, certain symbols that represent the syntax elements of which the coded picture is made up. Such symbols can include, for example, the mode in which a block is coded (such as, for example, intra mode, inter mode, bi-predicted mode, the latter two in merge submode or another submode), prediction information (such as, for example, intra prediction information or inter prediction information) that can identify certain sample or metadata that is used for prediction by the intra decoder (872) or the inter decoder (880), respectively, residual information in the form of, for example, quantized transform coefficients, and the like. In an example, when the prediction mode is inter or bi-predicted mode, the inter prediction information is provided to the inter decoder (880); and when the prediction type is the intra prediction type, the intra prediction information is provided to the intra decoder (872). The residual information can be subject to inverse quantization and is provided to the residue decoder (873).

The inter decoder (880) is configured to receive the inter prediction information, and generate inter prediction results based on the inter prediction information.

The intra decoder (872) is configured to receive the intra prediction information, and generate prediction results based on the intra prediction information.

The residue decoder (873) is configured to perform inverse quantization to extract de-quantized transform coefficients, and process the de-quantized transform coefficients to convert the residual from the frequency domain to the spatial domain. The residue decoder (873) may also require certain control information (to include the Quantizer Parameter (QP)), and that information may be provided by the entropy decoder (871) (data path not depicted as this may be low volume control information only).

The reconstruction module (874) is configured to combine, in the spatial domain, the residual as output by the residue decoder (873) and the prediction results (as output by the inter or intra prediction modules as the case may be) to form a reconstructed block, that may be part of the reconstructed picture, which in turn may be part of the reconstructed video. It is noted that other suitable operations, such as a deblocking operation and the like, can be performed to improve the visual quality.

It is noted that the video encoders (403), (603), and (703), and the video decoders (410), (510), and (810) can be implemented using any suitable technique. In an embodiment, the video encoders (403), (603), and (703), and the video decoders (410), (510), and (810) can be implemented using one or more integrated circuits. In another embodiment, the video encoders (403), (603), and (603), and the video decoders (410), (510), and (810) can be implemented using one or more processors that execute software instructions.

Aspects of the disclosure provide control techniques of coding tool(s) and functionalities with constraint flags in a coded video stream.

According to an aspect of the disclosure, picture size in a bitstream may stay the same or may change. In some related examples, video encoders and decoders can operate on a given picture size that is defined and remains constant for a coded video sequence (CVS), a group of pictures (GOP), or a similar multi-picture timeframe. In an example, such as in MPEG-2, system designs are known to change a horizontal resolution (and thus a picture size) dependent on factors such as activity of a scene, but only at I pictures, hence picture size is defined and remains constant typically for a GOP. Resampling of reference pictures for use of different resolutions within a CVS is known, for example, from ITU-T Rec. H.263 Annex P. However, the picture size in the CVS does not change, only the reference pictures are resampled, resulting potentially in only parts of a picture canvas being used (e.g., in the case of down-sampling), or only parts of a scene being captured (e.g., in the case of up-sampling). In some examples, such as in H.263 Annex Q, resampling of an individual macroblock by a factor of two in each dimension (e.g., upward or downward) is allowed. However, the picture size remains the same. When the size of the macroblock can be fixed, for example, in H.263, and thus the size of the macroblock does not need to be signaled.

In some related examples, a picture size in predicted pictures can be changed. In an example, such as VP9, reference picture resampling and changing of a resolution for a whole picture are allowed. In some examples (for example, Hendry, et. al, "On adaptive resolution change (ARC) for VVC", Joint Video Team document JVET-M0135-v1, Jan. 9-19, 2019, which are incorporated herein in their entireties), resampling of a whole reference picture to a different resolution (e.g., a higher resolution or a lower resolution) is allowed. Different candidate resolutions can be coded in a sequence parameter set (SPS) and can be referred to by per-picture syntax elements in a picture parameter set (PPS).

According to an aspect of the disclosure, a source video can be compressed by layered coding that can encode pictures into a bitstream that includes one or more layers with different qualities, such as different resolutions. The bitstream can have syntax elements that specify which layer(s) (or a set of layers) can be output at a decoder side. The set of layers to be output can be defined as an output layer set. For example, in a video codec that supports multiple layers and scalabilities, one or more output layer sets can be signaled in a video parameter set (VPS). Syntax elements specifying profile tier level (PTL) for the entire bitstream or one or more output layer sets can be signaled in a VPS, a decoder parameter set (DPS) that may be referred to as decoder capability information (DCI) in some examples, a SPS, a PPS, a SEI message, or the like. In the PTL information, general constraint information that can specify constraints on coding tools or functionalities can be present. It is desirable to efficiently represent and signal constraint information for various coding tools and functionalities.

In some examples, a term "sub-picture" can be used to refer to, for example, a rectangular arrangement of samples, blocks, macroblocks, coding units, or similar entities that is semantically grouped and may be independently coded in changed resolution. One or more sub-pictures can form a picture. One or more coded sub-pictures can form a coded picture. One or more sub-pictures can be assembled into a picture, and one or more sub pictures can be extracted from a picture. In some examples, one or more coded sub-pictures can be assembled in a compressed domain without transcoding to a sample level into a coded picture. In some examples, one or more coded sub-pictures can be extracted from a coded picture in the compressed domain.

In some examples, mechanisms that allow a change of a resolution of a picture or a sub-picture in a CVS by, for example, reference picture resampling can be referred to as adaptive resolution change (ARC). Control information used to perform adaptive resolution change can be referred to as ARC parameters. The ARC parameters can include filter parameters, scaling factors, resolutions of an output and/or a reference picture, various control flags, and/or the like.

In some examples, encoding/decoding of ARC is in the unit of a picture, thus a set of control information (ARC parameters) is used for the encoding/decoding a single and semantically independent coded video picture. In some examples, encoding/decoding of ARC is in the unit of a sub-picture, thus multiple sub-pictures in a picture can be encoded/decoded with independent ARC parameters. It is noted that ARC parameters can be signaled using various techniques.

Figure 9:
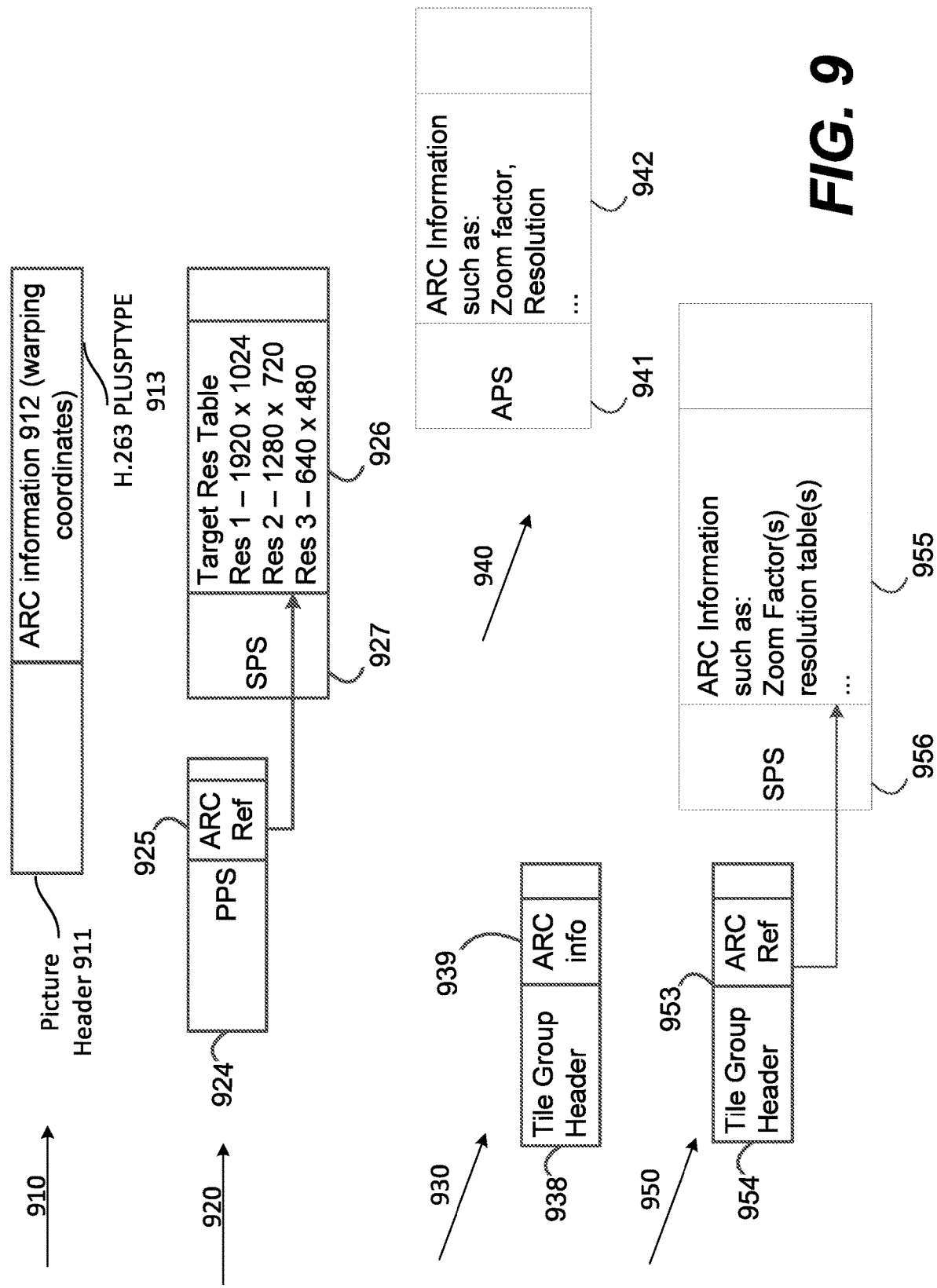
FIG. 9 shows examples for signaling adaptive resolution change (ARC) parameters according to embodiments of the disclosure.

FIG. 9 shows examples (e.g., options) of techniques for signaling ARC parameters according to some embodiments of the disclosure. Coding efficiency, complexity, and architecture can vary among the examples. A video coding standard or technology may choose one or more of the examples, or other variations, for signaling ARC parameters. The examples may not be mutually exclusive, and may be interchanged based on application needs, standards technologies, choice of an encoder, and/or the like.

According to an aspect of the disclosure, ARC parameters may be provided as classes of ARC parameters in various manners. In some examples, a class of ARC parameters includes upsample and/or downsample factors, separate or combined in an X dimension and a Y dimension. In an example, one or more short syntax elements that can point to a table including the upsample and/or downsample factors can be coded.

In some examples, a class of ARC parameters includes upsample and/or downsample factors, with an addition of a temporal dimension, indicating a constant speed zoom in and/or out for a given number of pictures. In an example, one or more short syntax elements that can point to a table including the upsample and/or downsample factors with the addition of the temporal dimension can be coded.

In some examples, a class of ARC parameters includes a resolution, in the X dimension or the Y dimension, in units of samples, blocks, macroblocks, CUs, or any other suitable granularity, of an input picture, an output picture, a reference picture, a coded picture, combined or separately. In some examples, there are more than one resolution used in video coding (e.g., one resolution for the input picture, another resolution for the reference picture), a set of values (corresponding to one of the resolutions) can be inferred from another set of values (corresponding to another of the resolutions). The determination of the values can be gated, for example, based on the use of flags. The usage of flags for gating which will be described in detail in further description.

In some examples, a class of ARC parameters includes warping coordinates that are similar to that used in the H.263 Annex P, in a suitable granularity as described above. The H.263 Annex P defines an efficient way to code the warping coordinates. Other efficient ways can be devised. For example, the variable length reversible, Huffman-style coding of warping coordinates of Annex P can be replaced by a suitable length binary coding where the length of the binary code word can be derived from a maximum picture size that is multiplied by a factor and offset by a value to allow for warping outside of boundaries of the maximum picture size.

In some examples, a class of ARC parameters includes upsample and/or downsample filter parameters. In an example, there is only a single filter for upsampling and/or downsampling. In another example, multiple filters can be used. In some examples, the filter parameters may be signaled to allow more flexibility in a filter design. The filter parameters can be selected by using an index in a list of possible filter designs. The filter may be fully specified (e.g., by specifying a list of filter coefficients, using suitable entropy coding techniques), the filter may be implicitly selected through upsample or downsample ratios which are signaled according to any of the mechanisms described above, and/or the like.

In the following description, a finite set of upsample or downsample factors (the same factor to be used in both the X dimension and the Y dimension) is used to illustrate signaling ARC parameters through a codeword. In some examples, the codeword can be variable length coded, for example, using an Ext-Golomb code for certain syntax elements in video coding specifications (e.g., H.264 and H.265).

FIG. 10 shows an example of a Table (1000) for mapping of upsample or downsample factors, codewords, and Ext-Golomb codes.

It is noted that other similar mappings can be devised according to an application and capabilities of upscale and downscale mechanisms available in a video compression technology or standard. In some examples, Table 1 can be suitably extended to additional values. It is noted that values may be represented by entropy coding mechanisms other than the Ext-Golomb code, for example, by using a binary coding. In an example, entropy coding mechanisms other than the Ext-Golomb code may have certain advantages when the resampling factors are of interest outside the video processing engines (e.g., an encoder and a decoder), for example, by media-aware network elements (MANEs). In some examples, when no resolution change is required (e.g., the original/target resolution being 1 in Table 1), a short Ext-Golomb code (e.g., only a single bit shown in Table 1) can be chosen, which can have a coding efficiency advantage, for example, over using binary codes for the most common case.

According to an aspect of the disclosure, the mapping table, such as Table 1 can be configurable. For example, the number of entries in Table 1, and corresponding semantics can be fully or partially configurable. In some examples, a basic outline of mapping table is conveyed in a high level parameter set, such as an SPS or a DPS. Alternatively or in addition, in some examples, one or more tables similar to Table 1 may be defined in a video coding technology or standard, and one of the tables may be selected through, for example, an SPS or a DPS.

The ARC information, such as an upsample or downsample factor coded as described above, may be included in a video coding technology or standard syntax. It is noted that one or more codewords can be used to control other classes of ARC information, such as the upsample or downsample filters. In some examples, a comparatively large amount of data is required for a filter or other data structures.

Referring to FIG. 9, in an example (910), such as in H.263 Annex P, ARC information (912) can be in a form of four warping coordinates, and is included in a picture header (911), such as in an H.263 PLUSPTYPE (913) header extension. The example (910) can be applied when i) a picture header is available, and ii) frequent changes of the ARC information are expected. However, the overhead when using the H.263-style signaling, such as shown in the example (910), can be high, and scaling factors may not be applicable among picture boundaries as the picture header can be of a transient nature.

Referring to FIG. 9, in an example (920), such as JVCET-M135-v1, ARC reference information (925) (e.g., an index) can be placed in a PPS (924) and can point to a table (or a target resolution table) (926) including target resolutions (e.g., resolutions 1-3). In an example, the table (926) is located inside an SPS (927). Placing the target resolutions in the table (926) in the SPS (927) can be justified by using the SPS as an interoperability negotiation point during capability exchange. A resolution can change, within a limited set of the values (e.g., the resolutions 1-3) in the table (926) from one picture to another picture by the referencing (e.g., ARC reference information (925)) in the appropriate PPS (924).

FIG. 9 also shows additional techniques, such as examples (930), (940) and (950), that may be used to convey ARC information in a video bitstream. The techniques may be used individually or can be used in suitable combination, in a same video coding technology or standard.

Referring to FIG. 9, in the example (930), ARC information (939), such as a resampling factor (or zoom factor) may be present in a header, such as a slice header, a GOB header, a tile header, a tile group header, or the like. A tile group header (938) is illustrated in FIG. 9 for example. The technique, illustrated by the example (930), can be used when the ARC information (939) can be coded with a small number of bits, such as a single variable length ue(v) or a fixed length codeword of a few bits.

According to an aspect of the disclosure, having the ARC information (939) in a header (e.g., the tile group header (938) in FIG. 9, a slice header, or a tile header) directly can have additional advantages in that the ARC information (939) may be applicable to a sub-picture represented by, for example, a corresponding tile group (or a slice, a tile), rather than an entire picture. In addition, in an example, even if a video compression technology or standard envisions only whole picture adaptive resolution changes (in contrast to, for example, a tile group based adaptive resolution changes), the example (930) can have certain advantages over the example (910) from an error resilience viewpoint.

Referring to FIG. 9, in the example (940), ARC information (942) may be present in a parameter set (941), such as a PPS, a header parameter set, a tile parameter set, an adaptation parameter set (APS), or the like. An APS (941) is illustrated in FIG. 9 for example. In some examples, the scope of the parameter set (941) can be not larger than a picture, for example, can be a picture, a tile group and the like. The use of the ARC information (e.g., the ARC information (942)) can be implicit through the activation of the relevant parameter set (e.g., the APS (941)). For example, when a video coding technology or standard contemplates only picture-based ARC, a PPS or equivalent may be appropriate.

Referring to FIG. 9, in the example (950), ARC reference information (953) may be present in a tile group header (954) or a similar data structure (e.g., a picture header, a slice header, a tile header, or a GOP header) as described above. The tile group header (954) is illustrated in FIG. 9 as an example. The ARC reference information (953) can refer to a subset of ARC information (955) available in a parameter set (956) with a scope beyond a single picture, for example an SPS, a DPS, or the like. The SPS (956) is illustrated in FIG. 9 as an example.

FIG. 11 shows some examples of ARC parameters signaling according to some embodiments of the disclosure. FIG. 11 shows syntax diagram examples used in video coding standards. In an example, the notation of the syntax diagrams roughly follows C-style programming. Lines in boldface can indicate syntax elements present in a bitstream, and lines without boldface can indicate control flow(s) or setting of variables.

Referring to FIG. 11, a tile group header (1101) includes syntax structure of a header applicable to a part (e.g., a rectangular part) of a picture. In an example, the tile group header (1101) can conditionally include, a variable length, Exp-Golomb coded syntax element dec_pic_size_idx (1102) (depicted in boldface). The presence of the syntax element (e.g., the dec_pic_size_idx (1102)) in the tile group header (1101) can be gated based on an adaptive resolution, for example, represented by a flag (e.g., an adaptive_pic_resolution_change_flag) (1103). A value of the flag (e.g., the adaptive_pic_resolution_change_flag) (1103) is not depicted in boldface, and thus the flag is present in the bitstream at a point where the flag occurs in the syntax diagram. Whether the adaptive resolution is in use for the picture or the part of the picture can be signaled in a high level syntax structure (e.g., an SPS (1110) in FIG. 11) inside or outside the bitstream.

Referring to FIG. 11, an excerpt of an SPS (1110) is shown. The SPS (1110) includes a first syntax element (1111) that is a flag (1111) (e.g., an adaptive_pic_resolution_change_flag). When the flag (1111) is true, the flag (1111) can indicate a use of the adaptive resolution which may require certain control information. In an example, the certain control information is conditionally present based on a value of the flag (1111) as shown by an if ( ) statement (1112) in the SPS (1110) and the tile group header (1101).

When the adaptive resolution is in use, such as shown in the example in FIG. 11, an output resolution in units of samples (or a resolution of an output picture) (1113) can be coded. In an example, the output resolution (1113) is coded based on a width resolution (e.g., an output_pic_width_in_luma_samples) and a height resolution (e.g., an output_pic_height_in_luma_samples). In a video coding technology or standard, certain restrictions to value(s) of the output resolution (1113) can be defined. For example, a level definition may limit a number of total output samples (e.g., a product of the output_pic_width_in_luma_samples and the output_pic_height_in_luma_samples). In some examples, a video coding technology or standard, or an external technology or standard (e.g., a system standard) can limit a numbering range for the width resolution and/or height resolution (e.g., the width resolution and/or the height resolution are divisible by a power of 2), an aspect ratio of the width resolution over the height resolution (e.g., a ratio of the width resolution over the height resolution is 4:3 or 16:9), or the like. In an example, the above restrictions may be introduced to facilitate hardware implementations.

In certain applications, an encoder can instruct a decoder to use a certain reference picture size rather than implicitly assume that a size is the output picture size. For example, a syntax element (e.g., a reference_pic_size_present_flag) (1114) gates a conditional presence of reference picture dimensions (1115). The reference picture dimensions (1115) can include, in an example, both a width (e.g., a reference_pic_width_in_luma_samples) and a height (e.g., a reference_pic_height_in_luma_samples).

Also in FIG. 11, a table of applicable decoding picture widths and heights is illustrated. In an example, the number of entries in the table can be expressed by a table indication (e.g., a syntax element num_dec_pic_size_in_luma_samples_minus1) (1116). The "minus1" can refer to the interpretation of the value of the syntax element (1116). For example, if the coded value is zero, one table entry is present. If the coded value is five, six table entries are present. For each entry in the table, the decoded picture width and height are included as syntax elements (1117).

The table entries represented by the syntax elements (1117) can be indexed using the syntax element dec_pic_size_idx (1102) in the tile group header (1101), and thus allowing different decoded sizes and zoom factors per tile group.

According to an aspect of the disclosure, certain video coding technologies or standards (e.g., VP9) can enable spatial scalability by implementing certain forms of reference picture resampling in conjunction with temporal scalability. In an embodiment, a reference picture is upsampled using ARC-style technologies to a higher resolution to form the base of a spatial enhancement layer. The upsampled picture can be refined, using normal prediction mechanisms (e.g., motion-compensated prediction for inter-prediction from reference pictures) at the high resolution for example to add detail.

In some examples, a value in a network abstraction layer (NAL) unit header, for example, a temporal ID field, is used to indicate temporal layer information and also spatial layer information. Using the value in NAL unit header to indicate both temporal layer information and the spatial layer information can enable the usage of existing selected forwarding units (SFUs) for scalable environment without modification. For example, the existing SFUs can be created and optimized for the temporal layer selected forwarding, based on the NAL unit header temporal ID value. Then, the existing SFUs can be used for spatial scalability (e.g., selection of spatial layers) without modification in some examples. In some examples, a mapping can be provided between a coded picture size and the temporal layer that is indicated by the temporal ID field in the NAL unit header.

According to an aspect of the disclosure, some features of a coded bitstream can be specified using profile, tier and level combination (PTL) information that includes profile, tier, level and general constraint information. In some examples, a profile defines a subset of features of a bitstream, such as color reproduction, resolution, additional video compression and the like. A video codec can define various profiles, such as a baseline profile (e.g., a simple profile with a low compression ratio), a high profile (a complex profile with a high compression ratio), a Main profile (e.g., a profile with a medium compression ratio between the baseline profile and the high profile, can be the default profile setting), and the like.

Further, tiers and levels can be used to specify certain constrains that define a bitstream in terms of maximum bit rate, maximum luma sample rate, maximum luma picture size, minimum compression ratio, maximum number of slices allowed, maximum number of tiles allowed, and the like. Lower tiers are more constrained than higher tiers and lower levels are more constrained than higher levels. In an example, a standard may define two tiers: Main and High. The Main tier is a lower tier than the High tier. The tiers are made to deal with applications that differ in terms of their maximum bit rate. The Main tier is designed for most applications while the High tier is designed for very demanding applications in an example. A standard can define multiple levels. A level is a set of constraints for a bitstream. In an example, for levels below level 4 only the Main tier is allowed. In some examples, a decoder that conforms to a given tier/level is required to be capable of decoding all bitstreams that are encoded for that tier/level and for all lower tiers/levels.

General constraint information may include constraint information on the video source type, coding tool and functionalities. For example, constraint flags can indicate whether inter coding tools, intra coding tools, a DBF, entropy coding, a transform, partitioning (e.g., a tile, a slice), buffer management, random access (e.g., IDR), a parameter set (e.g., an SPS, a PPS), and/or the like are present or used in the coded video bitstream. The constraint information can be signaled in parameter sets (e.g., an SPS, a VPS, or DCI). The constraint flags can be signaled in a high-level syntax structure (e.g., an SPS, a VPS, DCI).

According to some aspects of the disclosure, the PTL information can be associated with a scope (e.g., a portion of coded video data in a bitstream). In some examples, the PTL information can be specified for, for example, the entire bitstream, a CVS of the bitstream, each output layer set (OLS) of the bitstream, and/or the like, and can be signaled in a high-level syntax (HLS) structure, such as a VPS, a DPS, DCI, a SPS, a PPS, an APS, a GOP, a sequence, a header, an SEI message, or the like.

In some examples, the high-level syntax (HLS) is defined with regard to block level. Block-level coding tools can be used to decode pixels or samples within a picture to reconstruct the picture. The block-level coding tools can include any suitable coding tools used in reconstruction of a coding block, such as coding tools for inter prediction (or inter coding tools), coding tool(s) for intra prediction (or intra coding tools), an adaptive loop filter (ALF), a deblocking filter (DBF), entropy coding, a transform, and the like.

High-level syntax (HLS) can specify information on functionality, system-interface, picture-level control of tools and buffer control, and the like. For example, the HLS can specify partition (e.g., a tile, a slice, a subpicture), buffer management, random access (e.g., IDR, clean random access (CRA)), parameter set(s) (e.g., a VPS, an SPS, a PPS, an APS), reference picture resampling (RPR), scalability, and/or the like. The high-level syntax can be above a block-level.

Control information can have a suitable level, such as SPS level tool control information, PPS level tool control information, sequence level control information, bitstream level control information, and/or the like. In some examples, the PTL information is part of the control information and can be signaled as constraint flags in an HLS structure, and can indicate control or constraint of tools in the scope corresponding to the HLS structure. For example, the constraint flags for the PTL information can be provided in one of: sequence level control information and bitstream level control information. In an example, if certain tools are disabled by constraint flags in an HLS structure, and the tools are not used, for example, for coding blocks in a scope corresponding to the HLS.

FIG. 12 and FIG. 13 show an example of PTL information according to some embodiments of the disclosure. FIG. 12 shows a syntax structure example (1200) of a set of PTL syntax elements and FIG. 13 shows a syntax structure example (1300) of general constraint information.

In FIG. 12, the set of PTL syntax elements can include general_profile_idc, general_tier_flag, general_level_idc, num_sub_profiles, general_sub_profile_idc, sublayer_level_present_flag, ptl_alignment_zero_bit and sublayer_level_idc.

In FIG. 13, the general constraint information can include a plurality of constraint flags. In an example, a constraint flag (e.g., an intra_only_constraint_flag) (1305) equal to 1 can indicate that a parameter sh_slice_type should be I (i.e., a slice being an intra slice). The parameter sh_slice_type is a parameter in a slice header that specifies a coding type of the slice between types I, P and B. The constraint flag (e.g., the intra_only_constraint_flag) (1305) equal to 0 does not impose the constraint (e.g., the sh_slice_type should be I) for all coded pictures within the scope of the PTL information where other information (e.g., a profile_idc) can allow non intra-slices. In another example, a constraint flag (e.g., a no_alf_constraint_flag) (1306) equal to 1 can indicate that an sps_alf_enabled_flag is equal to 0 for all CVSs within the scope of the PTL information, and thus adaptive loop filtering is not in use even if the adaptive loop filtering is allowed based, for example, on the profile_idc. The constraint flag (e.g., the no_alf_constraint_flag) (1306) equal to 0 does not impose the above constraint.

In another example, a constraint flag (e.g., a no_lossless_coding_tool_constraint_flag) (1301) can be signaled in the general constraint information, as shown in FIG. 13. The constraint flag (e.g., the no_lossless_coding_tool_constraint_flag) (1301) equal to 1 can indicate that coding tool(s) related to lossless coding cannot be used within the scope of the PTL information including the constraint flag (1301). The constraint flag (e.g., the no_lossless_coding_tool_constraint_flag) (1301) equal to 0 does not impose the above constraint.

In another example, a constraint flag (e.g., a no_lossy_coding_tool_constraint_flag) (1302) can be signaled in the general constraint information, as shown in FIG. 13. The constraint flag (e.g., the no_lossy_coding_tool_constraint_flag) (1302) equal to 1 can indicate that coding tool(s) related to lossy coding cannot be used within the scope of the PTL information including the constraint flag (1302). The constraint flag (e.g., the no_lossy_coding_tool_constraint_flag) (1302) equal to 0 does not impose the above constraint.

In an embodiment, the constraint flag (e.g., the no_lossless_coding_tool_constraint_flag) (1301) may not be equal to 1 when the constraint flag (e.g., the no_lossy_coding_tool_constraint_flag) (1302) is equal to 1. Alternatively, the constraint flag (e.g., the no_lossy_coding_tool_constraint_flag) (1302) may not be equal to 1 when the constraint flag (e.g., the no_lossless_coding_tool_constraint_flag) (1301) is equal to 1.

The plurality of constraint flags in the general constraint information can be sorted in certain orders. The order can be set based on, for example, likelihoods of respective mechanisms and/or tools not being used in a scope of a PTL. The order can be referred to as a priority order. The order can be presented in the general constraint information syntax structure from a high priority to a low priority where the high priority indicates that non-use of a tool (or a mechanism) has a high likelihood and the low priority indicates that non-use of the tool (or the mechanism) has a low likelihood. Additional factors affecting the order can include tools likely being used only for specific use cases (e.g., tools for sub-pictures, scalability, and/or interlace support), impact of the tool for encoder/decoder/implementation complexity, and the like.

FIGS. 14A-14B show examples of PTL information that includes a syntax structure example (1410) of PTL syntax structure (also referred to as PTL bracket) and a syntax example (1420) for general constraint information syntax structure (also referred to as general constraint information bracket) according to some embodiments of the disclosure. In some example, a syntax element indicating a number of constraint flags (e.g., a num_available_constraint_flags) can be signaled. In an example, the syntax element indicating the number of constraints flag can be signaled in the PTL syntax structure, such as shown by (1401) in the syntax example (1410) as shown in FIG. 14A that can be outside of the syntax example (1420) for the general constraint information bracket. Alternatively, the syntax element indicating the number of constraint flags can be signaled in a beginning of the general constraint information bracket, such as the beginning of the syntax example (1420). When the syntax element (e.g., the num_available_constraint_flags) is present and a value of the syntax element (e.g., the num_available_constraint_flags) is equal to N, the first N constraint flags may be present in the general constraint information syntax structure. Further, other constraint flags may not be present and can be inferred to be equal to a specific value. N can be a non-negative integer.

In an embodiment, the value N (e.g., the num_available_constraint_flags) is in a range of 0 to a maximum number of constraint flags (e.g., a value of a parameter MaxNumConstraintFlags). The maximum number of constraint flags can be any positive integer. The value of the maximum number of constraint flags (e.g., MaxNumConstraintFlags) can be predefined to be 16, 32, 64, 128, or the like. When the value N (e.g., num_available_constraint_flags) is equal to 0, no constraint flags are present in the general constraint information syntax structure. Coding of the value N (e.g., num_available_constraint_flags) can be chosen such that a corresponding entropy-coded representation for the value N and the constraint flags can add up to a number divisible by 8 to ensure byte alignment.

In some examples, constraint flags can be categorized into one or more constraint information groups. Each constraint information group can include one or more constraint flags and can have a corresponding gate flag. A gate flag of a corresponding constraint information group can indicate whether constraint flag(s) in the corresponding constraint information group may be present. In an example, the gate flag can be referred to as a constraint group present flag. In general, the gate flag is associated with the corresponding constraint information group, and is associated with constraint flag(s) in the corresponding constraint information group. In an embodiment, the gate flag gates whether the constraint flag(s) in the corresponding constraint information group are present (or signaled) in constraint information. For example, if the gate flag of the corresponding constraint information group is equal to 1, the constraint flag(s) corresponding to the constraint information group can be present, for example, in the general constraint information. If the gate flag of the corresponding constraint information group is equal to 0, the constraint flag(s) corresponding to the constraint information group may not be present, for example, in the general constraint information. In an example, if all the gate flags are equal to 0, no constraint flags are present.

Constraint flags can have different copes. For example, a scope of constraint flags in DCI can be a coded video bitstream. A scope of constraint flags in a VPS can be CLVSs with multiple layers. A scope of constraint flags in an SPS can be a single CLVS.

FIGS. 15A-15B show an example of a general constraint information syntax structure (1500) according to an embodiment of the disclosure. The general constraint information syntax structure (1500) includes flags that represent general constraint information. Specifically, the general constraint information syntax structure (1500) includes one or more gate flags, such as a gate flag (e.g., a general_frame_structure_constraint_group_flag) (1501), a gate flag (e.g., a high_level_functionality_constraint_group_flag) (1502), a gate flag (e.g., a scalability_constraint_group_flag) (1503), a gate flag (e.g., a partitioning_constraint_group_flag) (1504), a gate flag (e.g., an intra_coding_tool_constraint_group_flag) (1505), a gate flag (e.g., an inter_coding_tool_constraint_group_flag) (1506), a gate flag (e.g., a transfom_contraint_group_flag) (1507), a gate flag (e.g., an inloop_filtering_constraint_group_flag) (1508) in FIG. 15A. The one or more gate flags (e.g., the gate flags (1501)-(1508)) can be present at the beginning of the general constraint information syntax structure (1500), as shown in FIG. 15A.

The gate flag (e.g., the general_frame_structure_constraint_group_flag) (1501) is associated with a constraint information group (1510), and is associated with constraint flags (1511)-(1514) that are in the constraint information group (1510). The gate flag (e.g., the general_frame_structure_constraint_group_flag) (1501) being equal to 1 can specify that the constraint flags (1511)-(1514) that are in the constraint information group (1510) may be present.

The constraint information group (1510) (or the constraint flags (1511)-(1514)) can be related to input source and frame packing (e.g. a packed or a projected frame). Referring to FIG. 15A, the constraint flags (1511)-(1514) correspond to a general_non_packed_constraint_flag (1511), a general_frame_only_constraint_flag (1512), a general_non_projected_constraint_flag (1513), and a general_one_picture_only_constrain_flag (1514). Otherwise, the gate flag (e.g., the general_frame_structure_constraint_group_flag) (1501) being equal to 0 can specify that constraint flags (1511)-(1514) that are in a constraint information group (1510) may not be present in the general constraint information syntax structure (1500).

Further, in some examples, the gate flag (e.g., the high_level_functionality_constraint_group_flag) (1502) being equal to 1 can specify that constraint flags related to high level functionality (e.g. reference picture resampling) that are in a constraint information group (1520) may be present as shown by FIG. 15B. Otherwise, the gate flag (e.g., the high_level_functionality_constraint_group_flag) (1502) being equal to 0 can specify that the constraint flags that are in the constraint information group (1520) may not be present in the general constraint information syntax structure (1500).

Referring back to FIG. 15A, the gate flag (e.g., the scalability_constraint_group_flag) (1503) being equal to 1 can specify that constraint flag(s) related to scalability (e.g. interlayer prediction) may be present. Otherwise, the constraint flag(s) related to the scalability may not be present in the general constraint information syntax structure (1500).

The gate flag (e.g., the partitioning_constraint_group_flag) (1504) being equal to 1 can specify that constraint flag(s) related to high level partitioning (e.g. a subpicture or a tile) may be present. Otherwise, the constraint flags related to the high level partitioning may not be present in the general constraint information syntax structure (1500).

The gate flag (e.g., the intra_coding_tool_constraint_group_flag) (1505) being equal to 1 can specify that constraint flag(s) related to intra coding (e.g. intra prediction) may be present. Otherwise, the constraint flag(s) related to the intra coding may not be present in the general constraint information syntax structure (1500).

The gate flag (e.g., the inter_coding_tool_constraint_group_flag) (1506) being equal to 1 can specify that constraint flag(s) related to inter coding (e.g. motion compensation for inter-picture prediction) may be present. Otherwise, the constraint flags related to the inter coding may not be present in the general constraint information syntax structure (1500).

The gate flag (e.g., the transfom_contraint_group_flag) (1507) being equal to 1 can specify that constraint flag(s) related to transform coding (e.g. multiple transform matrices) may be present. Otherwise, the constraint flags related to the transform coding may not be present in the general constraint information syntax structure (1500).

In an embodiment, when all gate flags (e.g., the gate flags (1501)-(1508) in FIG. 15A) are equal to 0, no constraint flags are present in the general constraint information syntax structure (e.g., the general constraint information syntax structure (1500)).

According to aspects of the disclosure, syntax can be designed such that control information including gate flags (e.g., the gate flags (1501)-(1508)), associated constraint flags (e.g., the constraint flags (1511)-(1512) and the constraint flags in the constraint information group (1520)), additional control information, and/or the like can be byte aligned, for example, a number of flags is divisible by 8 to preserve the byte alignment. In an example, a number of gate flags and constraint flags in constraint information (e.g., the general constraint information syntax structure (1500)) is divisible by 8. A byte-alignment mechanism can be used to achieve the byte-alignment of the control information. Referring to FIG. 15B, syntax (e.g., a while loop) (1530) can be used for byte-alignment.

In some embodiments, offset information, such as an offset (e.g., using a syntax element constraint_info_offset[ ])) and length information, such as a length (e.g., using a syntax element constraint_info_length[ ]) are present in the constraint information (e.g., at the beginning of a general constraint information syntax structure) to assist presenting constraint flag(s) in the respective constraint information group(s) associated with the gate flag(s) in the constraint information. In an embodiment, one or more of the at least one constraint information group are present in the coded video bitstream. For a constraint information group, an offset and a length can be present in the constraint information for the constraint information group. The offset can indicate the offset to a first constraint flag in the constraint information group, and the length can indicate the number of constraint flags in the constraint information group. In some examples, the number of constraint information groups can be explicitly indicated, for example, by a syntax element num_constraint_info_set. The value of num_constaint_info_ set can be an integer that is larger than or equal to 0. When the value of num_constraint_info_set is 0, constraint_info_offset[ ], constraint_info_length[ ] and constraint flags are not present in the general constraint information syntax structure.

In an embodiment, a constraint information offset (e.g., a syntax element constraint_info_offset[i]) and a constraint information length (e.g., a syntax element constraint_info_length[i]) can assist presenting constraint flags for the constraint information group i (i is a positive integer) in the constraint information (e.g., the general constraint information syntax structure). In an example, when a value of the constraint information offset (e.g., the syntax element constraint_info_offset[i]) is equal to 5, and a value of the constraint information length (e.g., the syntax element constraint_info_length[i]) is equal to 3, the fifth, the sixth, and the seventh constraint flags are associated with the constraint information group i and are present in the constraint information (e.g., the general constraint information syntax structure).

In an example, a run-length coding can be used to code the constraint flags that are specified in a pre-determined order (or a given order).

In an embodiment, a run-coding can be used where the constraint flags are specified in a pre-determined order (or a given order). Instead of coding the constraint flags directly, a suitably coded list of "skip" values can indicate constraint flags that are equal to zero, with a following constraint flag being implied to be equal to 1. The run-coding described above may be particularly efficient if (i) a number of the constraint flags is large and (ii) a small percentage of the constraint flags is equal to 1.

In an embodiment, one or more of the at least one constraint information group are present in the coded video bitstream. A plurality of constraint flags in the one or more of the at least one constraint information group is signaled according to the predetermined order. Accordingly, the plurality of constraint flags can be run-coded (e.g., run-encoded or run-decoded). Further, the prediction information for the subset of coding blocks can be determined based on the plurality of constraint flags.

In an embodiment, the at least one constraint flag in the constraint information group of the gate flag includes a plurality of constraint flags signaled according to a predetermined order. Accordingly, the plurality of constraint flags can be run-coded (e.g., run-encoded or run-decoded).

In an embodiment, a full list of the constraint flags can be specified in a video coding standard (e.g., a VVC specification), an external table, or the like. In an example, only available constraint flag(s) of the constraint flags are indicated, for example, by one or more of the following: a number of available constraint flags (e.g., a num_available_constraint_flags), gate flag(s) (or constraint group present flag(s)), constraint information offset information and constraint information length information, or the like are present in the coded video stream.

In an example, a full list of the constraint flags is specified and is available to an encoder and a decoder. The full list of the constraint flags can be stored at the decoder. The full list of the constraint flags can include 100 constraint flags. 10 of the 100 constraint flags are present in constraint information for a CLVS and thus are available to the subset of coding blocks in the CLVS. The 10 of the 100 constraint flags are referred to as the 10 available constraint flags. In an example, a number of available constraint flags (e.g., 10) is signaled. In an example, the 10 available constraint flags are in two constraint information groups and are gated by a first gate flag and a second gate flag. Thus, the first gate flag and the second gate flag can be signaled to indicate the 10 available constraint flags.

In an example, a first constraint information offset (e.g., the syntax element constraint_info_offset[0]) and a first constraint information length (e.g., the syntax element constraint_info_length[0]) are signaled. A second constraint information offset (e.g., the syntax element constraint_info_offset[1]) and a second constraint information length (e.g., the syntax element constraint_info_length[1]) are signaled. For example, the syntax element constraint_info_offset[0] is 15 and the syntax element constraint_info_length[0] is 3, and the syntax element constraint_info_offset[1] is 82 and the syntax element constraint_info_length[1] is 7, and thus indicate that the 15th to the 17th constraint flags and the 82th to the 88th constraint flags in the full list (e.g., the 100 constraint flags) are available or present in the constraint information.

In an embodiment, any of the various techniques (or methods, embodiments, examples) for efficient coding of constraint flags can be combined, employing suitable control information. The combination may be a suitable combination of two or more of such techniques. Alternatively, one of the various techniques (or methods, embodiments, examples) can be used independently. Constraint flags can be grouped. In certain group(s), run-coding can be used while other group(s) may employ straightforward binary coding.

The value of the maximum number of constraint flags (e.g., MaxNumConstraintFlags) can be predefined to be 16, 32, 64, 128, or the like.

The value of the maximum number of constraint flags (e.g., MaxNumConstraintFlags) can be determined by the profile information, such as general_profile_idc or general_sub_profile_idc, or a codec version information, so that the range of the number of constraint flags (e.g., the num_available_constraint_flags (1401)) can be restricted by the profile information or the version information. For example, the value of the number of constraint flags (e.g., the num_available_constraint_flags (1401)) in a main profile (e.g., where the MaxNumConstraintFlags=64) can be in the range of 0 to 64, while the value of the number of constraint flags (e.g., the num_available_constraint_flags (1401)) in an advanced profile (e.g., where MaxNumConstraintFlags=128) can be in the range of 0 to 128.

In an embodiment, the value of the number of constraint flags (e.g., the num_available_constraint_flags) can be inferred to be equal to a value predefined by the profile information, such as general_profile_idc or general_sub_profile_idc, or codec version information, so that the value of num_available_constraint_flags can be determined without explicitly signaling.

In some embodiments, reserved byte information can be present in the general constraint information syntax structure. For example, as shown in FIG. 13, the flags gci_num_reserved_bytes (1303) and gci_reserved_bytes[ ] (1304) can be present in the general constraint information syntax structure for extension of the general constraint information syntax structure. The flag gci_num_reserved_bytes can specify a number of reserved constraint bytes. In an example, the reserved constraint bytes are for signaling additional flags (e.g., additional constraint flags). The flag gci_reserved_byte[ ] may have any suitable value.

In an embodiment, a value of gci_num_reserved_bytes may be restricted or determined by the profile information, such as general_profile_idc or general_sub_profile_idc, or codec version information. With a base profile (or the main profile), the value of the flag gci_num_reserved_bytes can be 0. With an extended profile (or the advanced profile), the value of gci_num_reserved_bytes can be greater than 0.

In some embodiments, a field sequence flag can be signaled in a coded video bitstream. The field sequence flag can indicate whether pictures in an output layer are coded with field coding. In some examples, the field sequence flag can be signaled in an SPS using a syntax element an sps_field_seq_flag. In an embodiment, the flag sps_field_seq_flag may be present in an SPS. The flag sps_field_seq_flag being equal to 1 can indicate that a CLVS conveys pictures that represent fields. The flag sps_field_seq_flag being equal to 0 can indicate that the CLVS conveys pictures that represent frames.

In the general constraint information syntax structure in FIG. 13, the flag general_frame_only_constraint_flag may be present. The flag general_frame_only_constraint_flag being equal to 1 can specify that a scope for an output layer set (e.g., OlsInScope) conveys pictures that represent frames. The flag general_frame_only_constraint_flag being equal to 0 specifies that the scope for the output layer set (e.g., the OlsInScope) conveys pictures that may or may not represent frames. In an embodiment, the flag general_frame_only_constraint_flag indicates whether pictures in an output layer set is coded with field coding. The output layer set can include the subset of coding blocks. The flag sps_field_seq_flag can be false based on the flag general_frame_only_constraint_flag (e.g., being 1) indicating that a subset of the pictures is not coded with field coding. The subset of the pictures can be in one layer of the output layer set.

When the flag general_frame_only_constraint_flag is equal to 1, the value of the flag sps_field_seq_flag may be equal to 0.

In an embodiment, the flag pps_mixed_nalu_types_in_pic_flag may be present in a PPS. The flag pps_mixed_nalu_types_in_pic_flag being equal to 1 can specify that each picture referring to the PPS has more than one VCL NAL unit and the VCL NAL units do not have the same value of nal_unit_type. The flag pps_mixed_nalu_types_in_pic_flag being equal to 0 can specify that each picture referring to the PPS has one or more VCL NAL units and the VCL NAL units of each picture referring to the PPS have the same value of nal_unit_type. In the general constraint information syntax structure in FIG. 13, the flag no_mixed_nalu_types_in_pic_constraint_flag may be present. The flag no_mixed_nalu_types_in_pic_constraint_flag being equal to 1 can specify that the value of pps_mixed_nalu_types_in_pic_flag shall be equal to 0. The flag no_mixed_nalu_types_in_pic_constraint_flag being equal to 0 does not impose such a constraint.

In an embodiment, the flag general_one_picture_only_constraint_flag may be present in the general constraint information syntax structure, such as shown in FIG. 13. The general_one_picture_only_constraint_flag being equal to 1 can specify that there is only one coded picture in a bitstream. The flag general_one_picture_only_constraint_flag being equal to 0 does not impose such a constraint.

In an embodiment, the flag single_layer_constraint_flag may be present in the general constraint information syntax structure, such as shown in FIG. 13. The flag single_layer_constraint_flag being equal to 1 can specify that a sps_video_parameter_set_id shall be equal to 0. The flag single_layer_constraint_flag being equal to 0 does not impose such a constraint. When the flag general_one_picture_only_constraint_flag is equal to 1, the value of the flag single_layer_constraint_flag may be equal to 1.

In an embodiment, the flag all_layers_independent_constraint_flag may be present in the general constraint information syntax structure, such as shown in FIG. 13. The flag all_layers_independent_constraint_flag being equal to 1 can specify that a flag vps_all_independent_layers_flag may be equal to 1. The flag all_layers_independent_constraint_flag being equal to 0 does not impose such a constraint. When the flag single_layer_constraint_flag is equal to 1, the value of the flag all_layers_independent_constraint_flag may be equal to 1.

In an embodiment, the flag no_res_change_in_clvs_constraint_flag may be present in the general constraint information syntax structure, such as shown in FIG. 13. The flag no_res_change_in_clvs_constraint_flag being equal to 1 can specify that a flag sps_res_change_in_clvs_allowed_flag may be equal to 0. The flag no_res_change_in_clvs_constraint_flag being equal to 0 does not impose such a constraint. When the flag no_ref_pic_resampling_constraint_flag to 1, the value of the flag no_res_change_in_clvs_constraint_flag may be equal to 1.

In an embodiment, the flag no_mixed_nalu_types_in_pic_constraint_flag may be present in the general constraint information syntax structure in FIG. 13. The flag no_mixed_nalu_types_in_pic_constraint_flag being equal to 1 specifies that the value of the flag pps_mixed_nalu_types_in_pic_flag may be equal to 0. The flag no_mixed_nalu_types_in_pic_constraint_flag being equal to 0 does not impose such a constraint. When a flag one_subpic_per_pic_constraint_flag is equal to 1, the value of the flag no_mixed_nalu_types_in_pic_constraint_flag may be equal to 1.

In an embodiment, the flag no_trail_constraint_flag may be present in the general constraint information syntax structure in FIG. 13. The flag no_trail_constraint_flag being equal to 1 can specify that there may be no NAL unit with a nuh_unit_type equal to TRAIL_NUT present in OlsInScope (the OlsInScope is output layer set that includes all layers in the entire bitstream that refers to the DPS). The flag no_trail_constraint_flag being equal to 0 does not impose such a constraint. When the flag general_one_picture_only_constraint_flag is equal to 1, the flag no_trail_constraint_flag may be equal to 1.

In an embodiment, the flag no_stsa_constraint_flag may be present in general constraint information syntax structure in FIG. 13. The flag no_stsa_constraint_flag being equal to 1 can specify that there may be no NAL unit with the nuh_unit_type equal to STSA_NUT present in OlsInScope. The flag no_stsa_constraint_flag being equal to 0 does not impose such a constraint. When the flag general_one_picture_only_constraint_flag is equal to 1, the flag no_stsa_constraint_flag may be equal to 1.

In an embodiment, the flag no_trail_constraint_flag may be present in the general constraint information syntax structure in FIG. 13. The flag no_trail_constraint_flag being equal to 1 can specify that there may be no NAL unit with the nuh_unit_type equal to TRAIL_NUT present in OlsInScope. The flag no_trail_constraint_flag being equal to 0 does not impose such a constraint. When the flag general_one_picture_only_constraint_flag is equal to 1, the flag no_trail_constraint_flag may be equal to 1.

In an embodiment, the flag no_stsa_constraint_flag may be present in the general constraint information syntax structure in FIG. 13. The flag no_stsa_constraint_flag being equal to 1 can specify that there may be no NAL unit with the nuh_unit_type equal to STSA_NUT present in OlsInScope. The flag no_stsa_constraint_flag being equal to 0 does not impose such a constraint. When the flag general_one_picture_only_constraint_flag is equal to 1, the flag no_stsa_constraint_flag may be equal to 1.

In an embodiment, the flag no_idr_constraint_flag may be present in the general constraint information syntax structure, such as shown in FIG. 13. The no_idr_constraint_flag being equal to 1 can specify that there may be no NAL unit with the nuh_unit_type equal to IDR_W_RADL or IDR_N_LP present in OlsInScope. The flag no_idr_constraint_flag being equal to 0 does not impose such a constraint.

In an embodiment, the flag no_cra_constraint_flag may be present in the general constraint information syntax structure, such as shown in FIG. 13. The flag no_cra_constraint_flag being equal to 1 can specify that there may be no NAL unit with the nuh_unit_type equal to CRA_NUT present in OlsInScope. The flag no_cra_constraint_flag being equal to 0 does not impose such a constraint.

In an embodiment, the flag no_rasl_constraint_flag may be present in the general constraint information syntax structure in FIG. 13 (the flag no_rasl_constraint_flag is not shown). The flag no_rasl_constraint_flag being equal to 1 can specify that there may be no NAL unit with the nuh_unit_type equal to RASL_NUT present in OlsInScope. The flag no_rasl_constraint_flag being equal to 0 does not impose such a constraint. When the flag no_cra_constraint_flag is equal to 1, the value of the flag no_rasl_constraint_flag may be equal to 1.

In an embodiment, the flag no_radl_constraint_flag may be present in the general constraint information syntax structure, such as shown in FIG. 13. The flag no_radl_constraint_flag being equal to 1 can specify that there may be no NAL unit with the nuh_unit_type equal to RADL_NUT present in OlsInScope. The flag no_radl_constraint_flag being equal to 0 does not impose such a constraint. When the flag no_idr_constraint_flag is equal to 1 and the flag no_cra_constraint_flag is equal to 1, the value of the flag no_rasl_constraint_flag may be equal to 1.

Some aspects of the disclosure provide techniques for constraint flag signaling for range extensions, such as range extension with persistent Rice adaptation (e.g., the range extension including a coding tool for a statistics based Rice parameter derivation in a residual coding).

According to an aspect of the disclosure, residual coding can be performed based on Rice coding. The Rice coding uses a tunable parameter to divide an input value into two parts and then use different coding techniques to code the two parts. The tunable parameter is referred to as Rice parameter in some examples. The Rice parameter can affect the coding efficiency of Rice coding. Techniques can be used to determine the Rice parameter for specific applications to improve the coding efficiency for the specific applications. Some techniques to determine the Rice parameters may be included in a range extension of a video standard.

According to an aspect of the disclosure, some standards can be developed originally for certain applications. To make a standard applicable to other applications, range extension(s) are developed with tools to support the other applications. For example, HEVC originally targets applications with 4:2:0 chroma format at 8-10 bits per sample. To make the HEVC standard applicable to other formats and bitdepths besides the specific chroma format and the specific bitdepths, range extensions can be developed to support applications that use other chroma formats and/or higher bitdepths.

In order to restrict the feature set to what is needed for a particular group of applications, video coding standards define profiles, which can include defined decoder feature sets to be supported for interoperability with encoders that use these features. For example, a profile can define a set of coding tools or algorithms that can be used in generating a conforming bitstream. In addition to profiles, some standards (e.g., VVC, HEVC and the like) also defines levels and tiers. A level imposes restrictions on the bitstream related to spatial resolution, pixel rate, bit rate values and variations that may correspond to decoder processing load and memory capabilities. Level restrictions can be represented in terms of maximum samples rate, maximum picture size, maximum bit rate, minimum compression ratio, capacities of coded picture buffer, and the like. Higher values of level can correspond to higher complexity limits. Tiers modify the bit rate value and variation limits for each level. For example, the Main tier is intended for most applications, while the High tier is designed to address video contribution applications that are more demanding, such as have significantly higher bit rate values than video distribution applications. Each of profile, tier, and level affects the implementation and decoding complexities, and a combination of the three specifies an interoperability point for bitstreams and decoders.

In some examples, a decoder conforming to a certain tier and level is required to be capable of decoding all bitstreams that conform to the same tier or the lower tier of that level or any level below it, and decoders conforming to a specific profile can support all features in that profile. In some examples, encoders are not required to make use of any particular set of features supported in a profile, but are required to produce conforming bitstreams, i.e., bitstreams that obey the specified constraints that enable them to be decoded by conforming decoders.

In addition to the PTL information, a PTL syntax structure may also include a general constraints information (GCI) syntax structure, which includes a list of constraint flags and non-flag syntax elements indicating specific constraint properties of the bitstream.

In an example, HEVC originally includes three profiles that are referred to as Main profile, Main 10 profile and Main Still Picture profile. The three profiles have some restrictions, such as supporting only 4:2:0 chroma sampling. In the Main and Main Still Picture profiles, only a video precision of 8 bits per sample is supported, while the Main 10 profile supports up to 10 bits per sample. In the Main Still Picture profile, the entire bitstream includes only one coded picture.

In some examples, the HEVC with range extensions can support additional profiles. In an example, the following profiles are collectively referred to as range extension profiles: Monochrome profile, Monochrome 10 profile, Monochrome 12 profile, Monochrome 16 profile, Main 12 profile, Main 4:2:2 10 profile, Main 4:2:2 12 profile, Main 4:4:4 profile, Main 4:4:4 10 profile, Main 4:4:4 12 profile, Main Intra profile, Main 10 Intra profile, Main 12 Intra profile, Main 4:2:2 10 Intra profile, Main 4:2:2 12 Intra profile, Main 4:4:4 Intra profile, Main 4:4:4 10 Intra profile, Main 4:4:4 12 Intra profile, Main 4:4:4 16 Intra profile, Main 4:4:4 Still Picture profile and Main 4:4:4 16 Still Picture profile.

Some of the range extension profiles can support higher bitdepth and can be referred to as profiles for operation range extensions with high bitdepth. In some examples, the profiles for operation range extensions with high bitdepth include profiles that support more than 10 bits per sample, such as Main 12 profile, Main 12 4:4:4 profile, Main 16 4:4:4 profile, Main 12 Intra profile, Main 12 4:4:4 Intra profile, Main 16 4:4:4 Intra profile, Main 12 Still Picture profile, Main 12 4:4:4 Still Picture profile, Main 16 4:4:4 Still Picture profile and the like.

Specifically, the Main 12 profile allows for a bit depth of 8 bits to 12 bits per sample with support for 4:0:0 and 4:2:0 chroma sampling, both intra prediction and inter prediction modes. In some examples, decoders that conform to the Main 12 profile are capable of decoding bitstreams made with the following profiles: Monochrome, Monochrome 12, Main, Main 10, and Main 12.

The Main 12 4:4:4 profile allows for a bit depth of 8 bits to 12 bits per sample with support for 4:0:0, 4:2:0, 4:2:2, and 4:4:4 chroma sampling, and both intra prediction and inter prediction modes. In some examples, decoders that conform to the Main 12 4:4:4 profile are capable of decoding bitstreams made with the following profiles: Monochrome, Main, Main 10, Main 12, Main 10 4:2:2, Main 12 4:2:2, Main 4:4:4, Main 10 4:4:4, Main 12 4:4:4, and Monochrome 12.

The Main 16 4:4:4 profile allows for a bit depth of 8 bits to 16 bits per sample with support for 4:0:0, 4:2:0, 4:2:2, and 4:4:4 chroma sampling, and both intra prediction and inter prediction modes.

The Main 12 Intra profile allows for a bit depth of 8 bits to 12 bits per sample with support for 4:0:0 and 4:2:0 chroma sampling, and intra prediction mode.

The Main 12 4:4:4 Intra profile allows for a bit depth of 8 bits to 12 bits per sample with support for 4:0:0, 4:2:0, 4:2:2, and 4:4:4 chroma sampling, and intra prediction mode.

The Main 16 4:4:4 Intra profile allows for a bit depth of 8 bits to 16 bits per sample with support for 4:0:0, 4:2:0, 4:2:2, and 4:4:4 chroma sampling, and intra prediction mode.

The Main 12 Still Picture profile allows for a bit depth of 8 bits to 12 bits per sample with support for 4:0:0 and 4:2:0 chroma sampling. In the Main 12 Still Picture profile, the entire bitstream includes only one coded picture.

The Main 12 4:4:4 Still Picture profile allows for a bit depth of 8 bits to 12 bits per sample with support for 4:0:0, 4:2:0, 4:2:2, and 4:4:4 chroma sampling. In the Main 12 4:4:4 Still Picture profile, the entire bitstream includes only one coded picture.

The Main 16 4:4:4 Still Picture profile allows for a bit depth of 8 bits to 16 bits per sample with support for 4:0:0, 4:2:0, 4:2:2, and 4:4:4 chroma sampling. In the Main 16 4:4:4 Still Picture profile, the entire bitstream includes only one coded picture.

According some aspects of the disclosure, coding tool controls can be performed at various scopes (e.g., a portion of coded video data that is coded with the persistence of an instance of a syntax element for a coding tool control), such as a scope of a bitstream, a scope of a coded layer video sequence (CLVS), a picture, a slice of a picture and the like. In some examples, a coding tool control can be provided in a general constraint information (GCI) syntax structure that generally includes constraint information for a bitstream carrying an output layer set to a decoder. In some examples, a coding tool control can be provided in a sequence parameter set (SPS) associated with a CLVS, the SPS generally includes information for the CLVS. In some examples, a coding tool control can be provided in a picture header for a picture, and the picture header generally includes information for the picture. In some examples, a coding tool control can be provided in a slice header of a slice, the slice header generally includes information for the slice.

According to an aspect of the disclosure, control information for the coding tools in the range extension can be provided at the various scopes. In some examples, using a syntax element of a larger scope may improve coding efficiency. For example, a GCI syntax element value greater than 0 indicates that the bitstream is constrained in a particular way, typically to indicate that a particular coding tool is not used in the bitstream. Further, the GCI syntax element value equal to the value 0 signals that the associated constraint may not apply, such that the associated coding tool is allowed (but not required) to be used in the bitstream (if its use is supported in the indicated profile).

According to another aspect of the disclosure, when a coding tool is not used in coding of video data in a bitstream, indicating the no use of the coding tool, for example, in the PTL information and/or general constraint information, a video decoder without support of the coding tool may determine that the video decoder is able to decode the bitstream based on the signaling in the PTL information and/or the general constraint information, and the functionality of the video decoder can be extended.

In some embodiments, an encoder can produce a bitstream conforming to a video standard with range extension, but does not make use of one or more features supported in the range extension. In some examples, with the knowledge of no use of the one or more features in the range extension, a decoder conforming to the video standard but not supporting the one or more features in the range extension may determine that the decoder is able to decode the bitstream, and may accept the bitstream for decoding instead of rejecting the bitstream.

FIG. 16 shows a syntax structure (1600) of general constraint information according to some embodiments of the disclosure. In some examples, the syntax structure (1600) includes constraints to be applied to a bitstream, such as a bitstream including an output layer set to a decoder. In the FIG. 16 example, a syntax element denoted by gci_num_additional_bits in the syntax structure (1600) is used to specify a number of additional general constraint information (GCI) bits in the general constraint information syntax structure (1600) other than alignment zero bits syntax elements (when present). In some standards, the value of gci_num_additional_bits is required to be equal to 0 or 1. In some standards, decoders may allow values of gci_num_additional_bits greater than 1 to appear in the syntax structure.

In the FIG. 16 examples, the syntax structure (1600) includes 5 additional GCI bits (syntax elements) (1601)-(1605) denoted by general_no_extended_precision_constraint_flag, general_no_ts_residual_coding_rice_present_in_sh_constraint_flag, general_no_rrc_rice_extension_constraint_flag, general_no_persistent_rice_adaptation_constraint_flag, and general_no_reverse_last_sig_coeff_constraint_flag. The 5 additional GCI bits (1601)-(1605) respectively provide coding control information of coding tools in the scope of a bitstream of an output layer set in some examples FIG. 17 shows a syntax structure (1700) example of sequence parameter set (SPS) range extension according to some embodiments of the disclosure. The syntax structure (1700) can be added in a SPS for a CLVS to provide control of coding tools of range extension for the CLVS. The syntax structure (1700) includes 5 syntax elements (1701)-(1705) that are denoted by sps_extended_precision_flag, sps_ts_residual_coding_rice_present_in_sh_flag, sps_rrc_rice_extension_flag, sps_persistent_rice_adaptation_enabled_flag, and sps_reverse_last_sig_coeff_enabled_flag. The 5 syntax elements (1701)-(1705) provide coding control information of coding tools in the scope of a CLVS in some examples.

Specifically, in an embodiment, the GCI bit (1601) and the syntax element (1701) are used to provide, in different scopes, control of using an extended precision, such as control of a coding tool of the extended dynamic range for transform coefficients in the scaling and transformation processes and for binarization of some syntax elements, such as abs_remainder[ ] and dec_abs_level[ ] and the like.

The syntax element (1701) equal to 1 specifies that an extended dynamic range is used for transform coefficients in the scaling and transformation processes and for binarization of some syntax elements, such as abs_remainder[ ] and dec_abs_level[ ] and the like. The syntax element abs_remainder[scanning position n] is the remaining absolute value of a transform coefficient level that is coded with Golomb-Rice code at the scanning position n. When abs_remainder[ ] is not present, it is inferred to be equal to 0. The syntax element dec_abs_level[scanning position n] can correspond to an intermediate value that is coded with Golomb-Rice code at the scanning position n and is used to determine the level of the transform coefficient at the scanning position n. The syntax element (1701) equal to 0 specifies that the extended dynamic range is not used in the scaling and transformation processes and is not used for binarization of, for example, the syntax elements abs_remainder[ ] and dec_abs_level[ ] and the like. When not present, the value of the syntax element (1701) is inferred to be equal to 0.

In an example, a variable denoted by Log2TransformRange is used to determine the dynamic range for transform coefficients in the scaling and transformation processes and for binarization of certain syntax elements. For example, the variable Log2TransformRange can be the number of bits for representing the transform coefficients in the scaling and transformation processes and for binarization of certain syntax elements. The dynamic range can be a difference of a largest number and a smallest number represented using the number of bits. In an example, the variable Log2TransformRange is derived according to the syntax element (1701) sps_extended_precision_flag, such as using Eq. (1):

$$\text{Log2TransformRange} = \text{sps\_extended\_precision\_flag?Max}(15, \text{Min}(20, \text{BitDepth}+6)):15 \quad \text{Eq. (1)}$$

The dynamic range for transform coefficients in the scaling and transformation processes and for binarization of certain syntax elements can be determined based on the variable Log2TransformRange. In some examples, when the flag sps_extended_precision_flag has value 0, the extended dynamic range feature (e.g., a coding tool of the extended dynamic range) is not used, and the dynamic range of the transform coefficients is based on a fixed number of bits, such as 15 bits. When the flag sps_extended_precision_flag has value 1, the extended dynamic range feature is enabled, and the number of bits to represent the transform coefficients in the scaling and transform processing can be one of 15 bits, 16 bits, 17 bits, 18 bits, 19 bits, and 20 bits based on the bitdepth BitDepth in the Eq. (1) example. The dynamic range of the transform coefficients can be determined based on the number of bits.

According to an aspect of the disclosure, a syntax element (e.g., denoted by sps_bitdepth_minus8) can be used to signal the bit depth of the samples of the luma and chroma arrays (e.g., denoted BitDepth), and the value of the luma and chroma quantization parameter range offset (e.g., denoted by QpBdOffset). In an example, the bit depth BitDepth can be calculated according to Eq. (2), and the QP range offset QpBdOffset can be calculated according to Eq. (3):

$$\text{BitDepth} = 8 + \text{sps\_bitdepth\_minus8} \quad \text{Eq. (2)}$$

$$\text{QpBdOffset} = 6 \times \text{sps\_bitdepth\_minus8} \quad \text{Eq. (3)}$$

In some examples, the GCI bit (1601) equal to 1 specifies that the syntax element (1701) for all pictures in a scope for an output layer set (OlsInScope) may be equal to 0. The GCI bit (1601) equal to 0 does not impose such a constraint. Thus, the GCI bit (1601) equal to 1 can specify no use of the extended dynamic range coding tool in the coding of the bitstream.

In some embodiments, the GCI bit (1602) and the syntax element (1702) are used to provide, in different scopes, control of a coding tool of a slice based Rice coding for residual coding in the transform skip mode, such as a slice based Rice parameter selection for residual coding in the transform skip mode.

According to an aspect of the disclosure, a slice based Rice parameter selection for transform skip residual coding can be included in a range extension of a video standard. In some examples, one control flag (e.g., denoted by sps_ts_residual_coding_rice_present_in_sh_flag, syntax element (1702)) is signaled in a sequence parameter set (SPS) when transform skip mode is enabled (e.g., syntax element sps_tranform_skip_enabled_flag is true) to indicate the signaling of Rice parameter for the transform skip slices is enabled or disabled, such as shown in FIG. 17.

When the control flag is signaled as enabled (e.g., equal to "1"), one syntax element (e.g., denoted by sh_ts_residual_coding_rice_idx_minus1) is further signaled for each transform skip slice, for example in the slice header, to indicate a selection of the Rice parameter of that transform skip slice. When the control flag is signaled as disabled (e.g. equal to "0"), no further syntax element is signaled at slice level (e.g., slice header) to indicate the Rice parameter selection for the transform skip slice and a default Rice parameter may be used for all the transform skip slices in coded video data that refers to the SPS in an example.

For example, the syntax element (1702) equal to 1 in an SPS specifies that a slice header flag denoted by sh_ts_residual_coding_rice_idx_minus1 may be present in slice header (e.g., slice_header( )) syntax structures of slices that refer to the SPS. The syntax element (1702) equal to 0 in an SPS specifies that the slice header flag sh_ts_residual_coding_rice_idx_minus1 is not present in slice_header( ) syntax structures of slices referring to the SPS. When not present, the value of sps_ts_residual_coding_rice_present_in_sh_flag is inferred to be equal to 0 in some examples.

In some examples, syntax element can be included in general constraint information to control, in a scope of an output layer set, the use of the coding tool of a slice based Rice coding for residual coding in the transform skip mode. For example, the syntax element (1602) equal to 1 specifies that the syntax element (1702) for all pictures in a scope for an output layer set (OlsInScope) may be equal to 0. The syntax element (1602) equal to 0 does not impose such a constraint. Thus, in some examples, the GCI bit (1602) equal to 1 in a bitstream can specify no use of the slice based Rice parameter selection for transform skip residual coding for coding the bitstream.

In some embodiments, the GCI bit (1603) and the syntax element (1703) are used to provide, in different scopes, control of one or more coding tools for Rice parameter derivation for the binarization of some syntax elements, such as abs_remainder[ ] and dec_abs_level[ ] and the like in the regular residual coding (RRC). In some examples, the regular residual coding (RRC) refers to some techniques for coding blocks that are obtained by transform and quantization. In some examples, the RRC can be modified for blocks that are obtained by quantization only. In some examples, transform skip residual coding (TSRC) refers to some techniques that are dedicated for coding blocks that are obtained bypassing transform (also referred to as transform skip).

In some examples, a video coding standard may include one or more coding tools for Rice parameter derivation for the binarization of some syntax elements, such as abs_remainder[ ] and dec_abs_level[ ], and a range extension of the video coding standard can include one or more alternative coding tools for Rice parameter derivation for the binarization of some syntax elements, such as abs_remainder[ ] and dec_abs_level[ ].

In some examples, a video standard uses a local template based technique for Rice parameter derivation. For examples, a template that includes one or more (e.g., 5 in an example) neighboring coefficient levels is used for the rice parameter derivation. For example, a sum of absolute coefficient values inside the template can be calculated, then the Rice parameter is determined based on the sum. In an example, a look up table can be used to determine the Rice parameter based on the sum.

It is noted that the Rice parameter can be determined by other suitable coding tools. In an example, an equation can be used to determine the Rice parameter based on the sum. In another example, context modeling can be used to determine the Rice parameter based on statistics of neighboring coefficient levels. In some examples, the range extension of the video standard can specify one or more alternative coding tools for the Rice parameter derivation.

In some examples, the range extension of the video standard can include modifications to the RRC for use in other scenarios. In an example, the range extension can include a different context modeling tool and a residual signal rotation tool for residual coding in the transform skip mode.

In some examples, the syntax element (1703) in an SPS equal to 1 specifies that an alternative Rice parameter derivation (e.g., an alternative coding tool for Rice parameter derivation in the range extension) for the binarization of abs_remainder[ ] and dec_abs_level[ ] is used for coding a CLVS that refers to the SPS. The syntax element (1703) equal to 0 specifies that the alternative Rice parameter derivation for the binarization of abs_remainder[ ] and dec_abs_level[ ] is not used for coding the CLVS that refers to the SPS. When not present, the value of syntax element (1703) is inferred to be equal to 0.

In some examples, the syntax element (1603) equal to 1 specifies that syntax element (1703) for all pictures in a scope of an output layer set (OlsInScope) may be equal to 0. The syntax element (1603) equal to 0 does not impose such a constraint. Thus, in some examples, the GCI bit (1603) equal to 1 can specify no use of the alternative Rice parameter derivation (e.g., an alternative coding tool for Rice parameter derivation specified in the range extension specified) for the binarization of abs_remainder[ ] and dec_abs_level[ ] for coding the bitstream.

In some embodiments, the GCI bit (1604) and the syntax element (1704) are used to provide, in different scopes, control of statistics based Rice parameter derivation for the binarization of abs_remainder[ ] and dec_abs_level[ ].

According to an aspect of the disclosure, Rice parameter derivation for the binarization of abs_remainder[ ] and dec_abs_level[ ] can be initialized at a start of each transform unit (TU) using statistics accumulated from previous TUs. In some examples, the statistics based Rice parameter derivation can be included in a range extension of a video standard.

In some examples, a control flag e.g., the syntax element (1704) denoted by sps_persistent_rice_adaptation_enabled_flag in an SPS is used to control the statistics based Rice parameter derivation. For example, the syntax element (1704) equal to 1 in an SPS specifies that Rice parameter derivation for the binarization of abs_remainder[ ] and dec_abs_level[ ] is initialized at the start of each TU using statistics accumulated from previous TUs. The syntax element (1704) equal to 0 specifies that no previous TU state is used in Rice parameter derivation of the current TU. When not present, the value of the syntax (1704) is inferred to be equal to 0.

Further, in an embodiment, the syntax element (1604) equal to 1 specifies that syntax element (1704) for all pictures in a scope for an output layer set (OlsInScope) may be equal to 0. The syntax element (1604) equal to 0 does not impose such a constraint. Thus, in some examples, the GCI bit (1604) equal to 1 can specify no use of the statistics based Rice parameter derivation for coding the bitstream.

In some embodiments, the GCI bit (1605) and the syntax element (1705) are used to provide, at different scopes, control of a coding tool that is used to code a position of a last significant coefficient during an entropy coding of transform coefficients. In an example, the position of the last significant coefficient can be coded by different coding tools. For example, a video standard may specify a first coding tool that can determine the position of the last significant coefficient by coding two coordinates of the position denoted by LastSignificantCoeffX and LastSignificantCoeffY variables; and a range extension of the video standard can specify alternative coding tool, such as a second coding tool that can determine the position of the last significant coefficient by coding relative coordinates of the last significant coefficient with reference to a bottom-right corner of a zero-out transform block in an example.

In some examples, the syntax element (1705) equal to 1 in an SPS specifies that a slice header flag (slice scope) denoted by sh_reverse_last_sig_coeff_flag is present in slice header syntax structures (e.g., slice_header( ) in some examples) that refer to the SPS. The syntax element (1705) equal to 0 in an SPS specifies that the slice header flag sh_reverse_last_sig_coeff_flag is not present in the slice header syntax structures that refer to the SPS, and the slice header flag sh_reverse_last_sig_coeff_flag may be inferred to be zero. When not present, the value of syntax element (1705) is inferred to be equal to 0.

In some examples, the value of the slice header flag sh_reverse_last_sig_coeff_flag of a slice is used to determine the position derivation of the last significant coefficient in transform coefficients in the scaling and transformation processes in the coding of the slice. In an example, when sh_reverse_last_sig_coeff_flag is equal to 1, the last significant coefficient position is coded by the alternative coding tool in the range extension of the video standard, such as the second coding tool; otherwise, the current coordinates for the last significant coefficient position are coded by the first coding tool.

In some examples, the GCI bit (1605) equal to 1 specifies that the syntax element (1705) for all pictures in a scope for an output layer set (OlsInScope) may be equal to 0. The GCI bit (1605) equal to 0 does not impose such a constraint. Thus, the GCI bit (1605) equal to 1 can specify no use of the second coding tool in the position derivation of the last significant coefficient for the scope of the bitstream.

Figure 18:
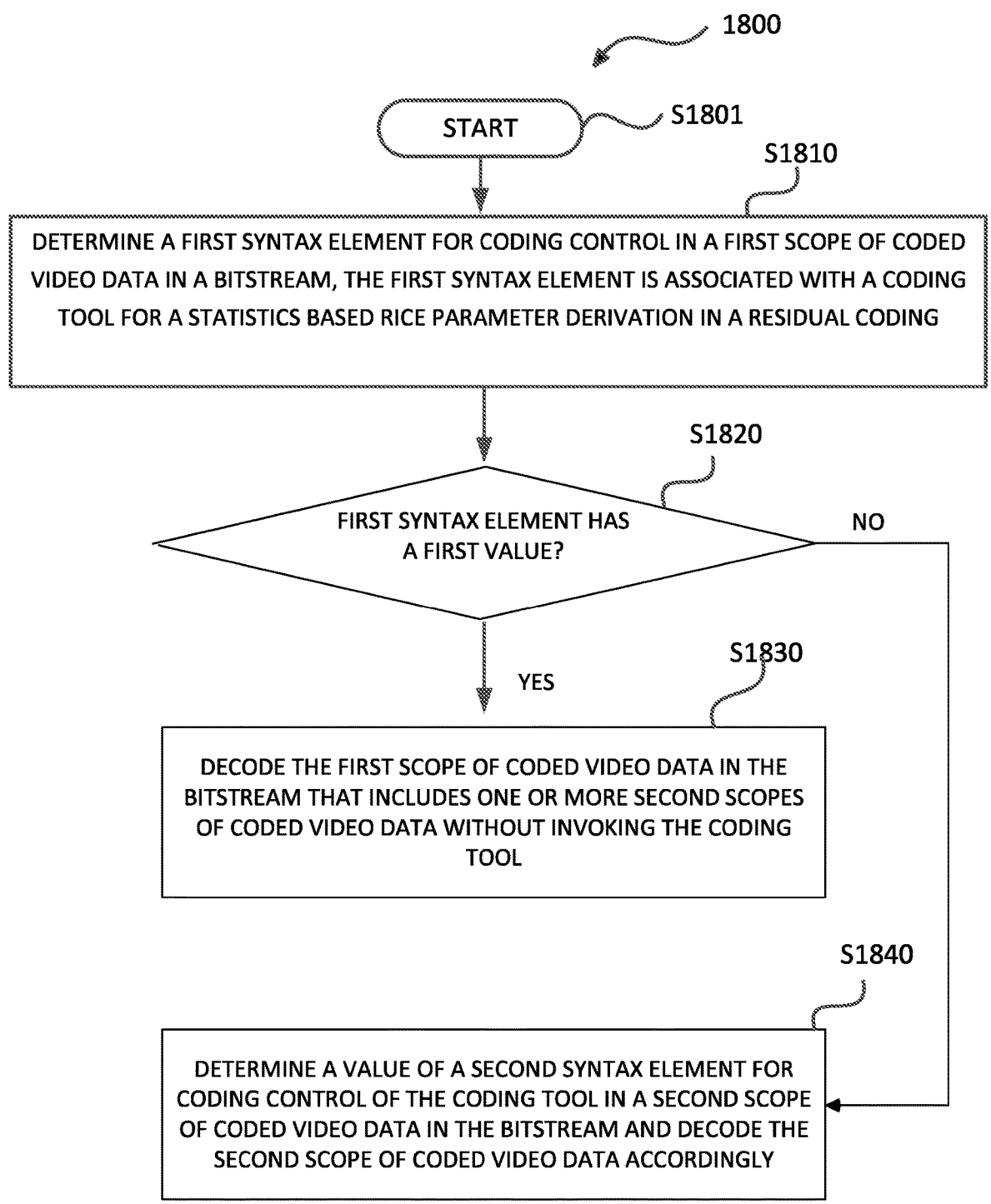
FIG. 18 shows a flow chart outlining a process according to an embodiment of the disclosure.

FIG. 18 shows a flow chart outlining a process (1800) according to an embodiment of the disclosure. The process (1800) can be used in a video decoder. In various embodiments, the process (1800) is executed by processing circuitry, such as the processing circuitry in the terminal devices (310), (320), (330) and (340), the processing circuitry that performs functions of the video decoder (410), the processing circuitry that performs functions of the video decoder (510), and the like. In some embodiments, the process (1800) is implemented in software instructions, thus when the processing circuitry executes the software instructions, the processing circuitry performs the process (1800). The process starts at (S1801) and proceeds to (S1810).

At (S1810), a value of a first syntax element (e.g., general_no_persistent_rice_adaptation_constraint_flag) for coding control in a first scope of coded video data (e.g., an output layer set) in a bitstream is determined. The first syntax element is associated with a coding tool for a statistics based Rice parameter derivation in a residual coding, such as a coding tool of persistent Rice adaptation defined in a range extension of a video standard for a statistics based Rice parameter derivation in a residual coding.

In an example, the first syntax element is decoded from a syntax structure for general constraint information in response to a syntax element (e.g., gci_num_additional_bits) in the syntax structure indicating additional bits for general constraint information in the syntax structure.

In some examples, the coding tool is defined in a range extension of a standard. In an example, the video decoder may support the standard but may not support the coding tool in the range extension of the standard. In another example, the video decoder supports the range extension of the standard.

At (S1820), when the value of the first syntax element is a first value, the process proceeds to (1830); otherwise, the process proceeds to (S1840). The first value is indicative of no use of the coding tool in the coding of the first scope of coded video data in the bitstream that includes one or more second scopes of coded video data (e.g., one or more CLVS in the output layer set).

In some examples, the first syntax element is in general constraint information for coding control of pictures in an output layer set output at the decoder. In an example, the first value of the first syntax element is indicative of no use of the coding tool in coding of each coded layer video sequence (CLVS) in the output layer set.

At (S1830), in response to the first syntax element being the first value, the first scope of coded video data in the bitstream is decoded without invoking the coding tool.

In some examples, a second syntax element (e.g., sps_persistent_rice_adaptation_enabled_flag) for coding control of a coded layer video sequence (CLVS) in the bitstream is constrained to have a value indicative of no invoking of the coding tool for decoding the CLVS.

At (S1840), in response to the first syntax element being a second value, a value of a second syntax element (e.g., sps_extended_precision_flag) for coding control of a second scope of coded video data, such as coded layer video sequence (CLVS), in the bitstream is determined for decoding of the coded video data in the second scope. The second syntax element is indicative of a use/no use of the coding tool in the CLVS. In an example, the second syntax element is not presented in a sequence parameter set (SPS) for the CLVS, the value of the second syntax element is inferred for indicating a no use of the coding tool in the CLVS.

The second scope of the coded video data is then decoded (e.g., with invoking or without invoking the coding tool) according to the value of the second syntax element. In some examples, in response to the value of the syntax element being indicative of a use of the coding tool in the CLVS, the coding tool is invoked during the decoding of the video data in the second scop. For example, statistics of coefficients decoded from one or more transform units prior to a current transform unit can be determined. An initial value of the Rice parameter for the current transform unit is determined based on the statistics. Then, coefficients of the current transform unit can be decoded based on the Rice parameter.

The process (1800) can be suitably adapted. Step(s) in the process (1800) can be modified and/or omitted. Additional step(s) can be added. Any suitable order of implementation can be used.

Figure 19:
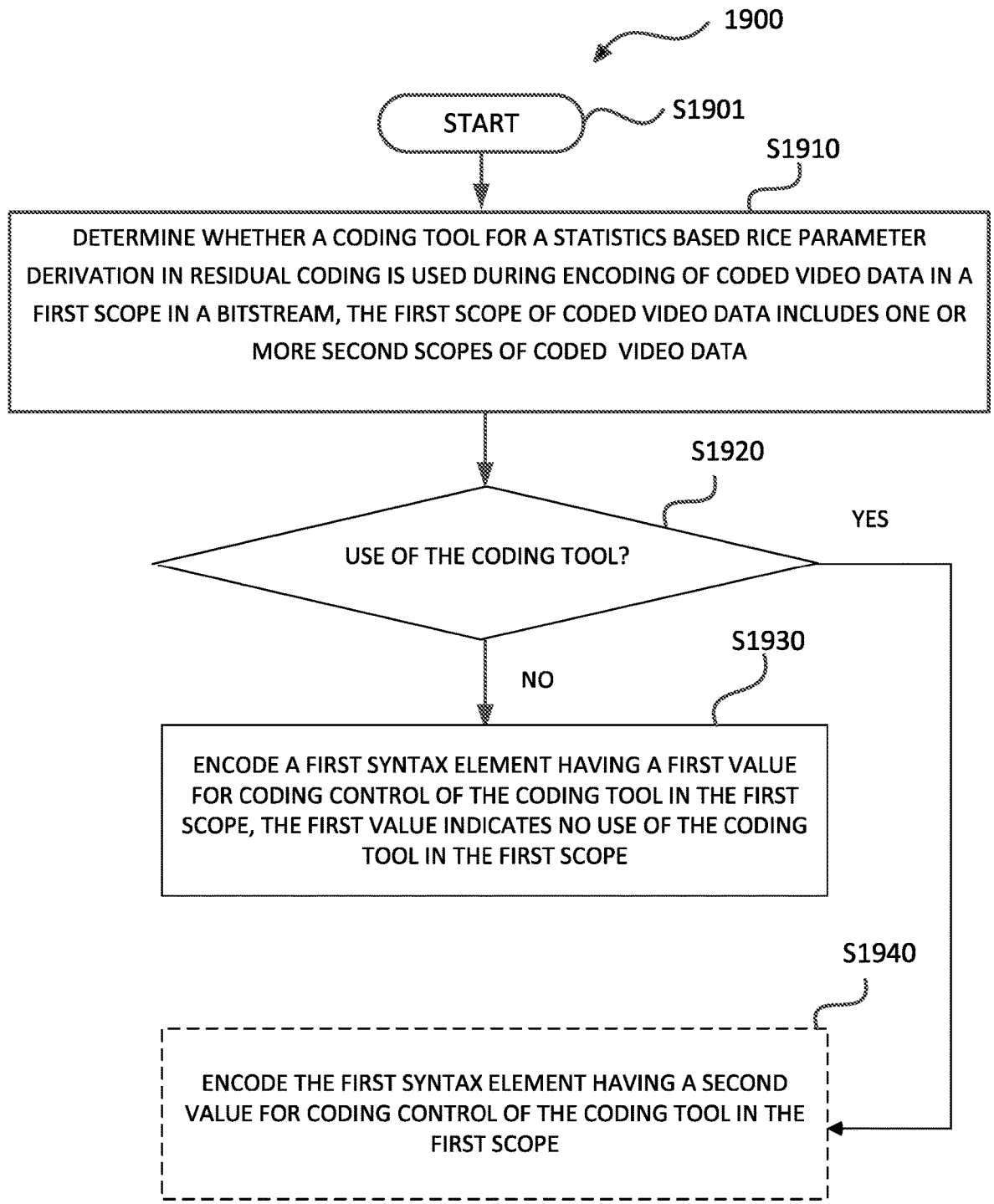
FIG. 19 shows a flow chart outlining a process according to an embodiment of the disclosure.

FIG. 19 shows a flow chart outlining a process (1900) according to an embodiment of the disclosure. The process (1900) can be used in a video encoder. In various embodiments, the process (1900) is executed by processing circuitry, such as the processing circuitry in the terminal devices (310), (320), (330) and (340), the processing circuitry that performs functions of the video encoder (403), the processing circuitry that performs functions of the video encoder (603), the processing circuitry that performs functions of the video encoder (703), and the like. In some embodiments, the process (1900) is implemented in software instructions, thus when the processing circuitry executes the software instructions, the processing circuitry performs the process (1900). The process starts at (S1901) and proceeds to (S1910).

At (S1910), the processing circuitry determines whether a coding tool for a statistics based Rice parameter derivation in a residual coding (e.g., a coding tool of persistent Rice adaptation defined in a range extension of a video standard for a statistics based Rice parameter derivation in a residual coding) is used during encoding of a first scope (e.g., an output layer set) of coded video data in a bitstream. The first scope of coded video data includes one or more second scopes (e.g., CLVSs) of coded video data.

In some examples, the processing circuitry can determine whether the coding tool is used based on second syntax elements (e.g., sps_persistent_rice_adaptation_enabled_flag) for coding control of coded layer video sequences (CLVSs) in the bitstream.

At (S1920), when the coding tool is not used in the coding of the first scope of coded video data, the process proceeds to (S1930); otherwise, the process proceeds to (S1940).

At (S1930), a first syntax element (e.g., general_no_persistent_rice_adaptation_constraint_flag) having a first value is encoded in the bitstream. The first syntax element is for coding control in the first scope of coded video data (e.g., an output layer set) in the bitstream. The first syntax element is associated with the coding tool for a statistics based Rice parameter derivation in residual coding. The first value indicates a no use of the coding tool in the coding of the first scope of coded video data.

In an example, the first syntax element is encoded in a syntax structure for general constraint information, and a syntax element (e.g., gci_num_additional_bits) in the syntax structure is adjusted to indicate additional bits for general constraint information in the syntax structure.

At (S1940), the first syntax element having a second value is encoded in the bitstream. In some examples, the first syntax element is not encoded in the bitstream, for example, in the case the second value is the default value for the first syntax element, and thus the first syntax element can be inferred if not presented, then (S1940) can be skipped.

The process (1900) can be suitably adapted. Step(s) in the process (1900) can be modified and/or omitted. Additional step(s) can be added. Any suitable order of implementation can be used.

The techniques described above (e.g., the techniques for signaling constraints flags, adaptive resolution parameters, and/or the like) can be implemented as computer software using computer-readable instructions and physically stored in one or more computer-readable media. For example, FIG. 20 shows a computer system (2000) suitable for implementing certain embodiments of the disclosed subject matter.

The computer software can be coded using any suitable machine code or computer language, that may be subject to assembly, compilation, linking, or like mechanisms to create code comprising instructions that can be executed directly, or through interpretation, micro-code execution, and the like, by one or more computer central processing units (CPUs), Graphics Processing Units (GPUs), and the like.

The instructions can be executed on various types of computers or components thereof, including, for example, personal computers, tablet computers, servers, smartphones, gaming devices, internet of things devices, and the like.

Figure 20:
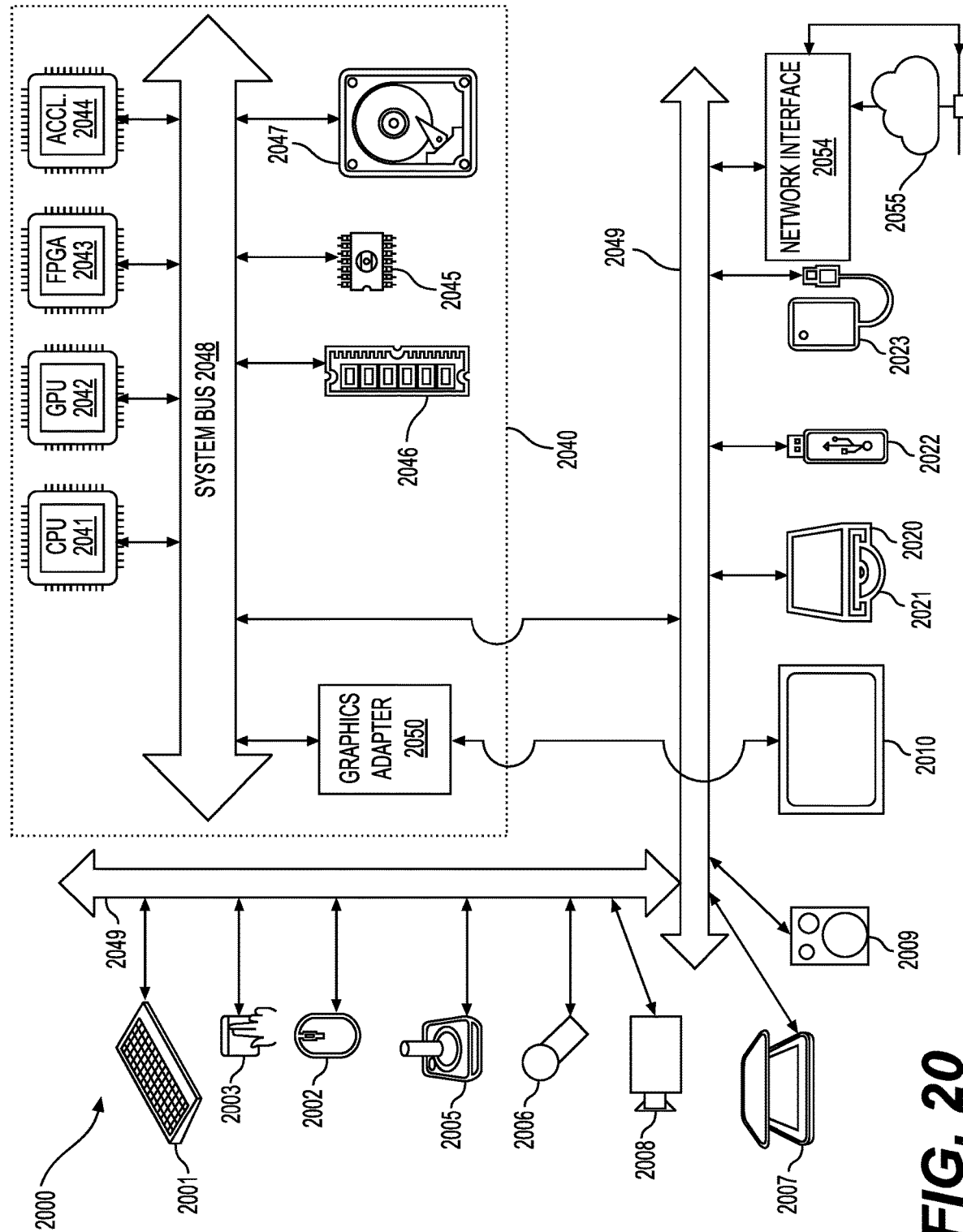
FIG. 20 is a schematic illustration of a computer system in accordance with an embodiment.

The components shown in FIG. 20 for computer system (2000) are exemplary in nature and are not intended to suggest any limitation as to the scope of use or functionality of the computer software implementing embodiments of the present disclosure. Neither should the configuration of components be interpreted as having any dependency or requirement relating to any one or combination of components illustrated in the exemplary embodiment of a computer system (2000).

Computer system (2000) may include certain human interface input devices. Such a human interface input device may be responsive to input by one or more human users through, for example, tactile input (such as: keystrokes, swipes, data glove movements), audio input (such as: voice, clapping), visual input (such as: gestures), olfactory input (not depicted). The human interface devices can also be used to capture certain media not necessarily directly related to conscious input by a human, such as audio (such as: speech, music, ambient sound), images (such as: scanned images, photographic images obtain from a still image camera), video (such as two-dimensional video, three-dimensional video including stereoscopic video).

Input human interface devices may include one or more of (only one of each depicted): keyboard (2001), mouse (2002), trackpad (2003), touch screen (2010), data-glove (not shown), joystick (2005), microphone (2006), scanner (2007), camera (2008).

Computer system (2000) may also include certain human interface output devices. Such human interface output devices may be stimulating the senses of one or more human users through, for example, tactile output, sound, light, and smell/taste. Such human interface output devices may include tactile output devices (for example tactile feedback by the touch-screen (2010), data-glove (not shown), or joystick (2005), but there can also be tactile feedback devices that do not serve as input devices), audio output devices (such as: speakers (2009), headphones (not depicted)), visual output devices (such as screens (2010) to include CRT screens, LCD screens, plasma screens, OLED screens, each with or without touch-screen input capability, each with or without tactile feedback capability—some of which may be capable to output two dimensional visual output or more than three dimensional output through means such as stereographic output; virtual-reality glasses (not depicted), holographic displays and smoke tanks (not depicted)), and printers (not depicted).

Computer system (2000) can also include human accessible storage devices and their associated media such as optical media including CD/DVD ROM/RW (2020) with CD/DVD or the like media (2021), thumb-drive (2022), removable hard drive or solid state drive (2023), legacy magnetic media such as tape and floppy disc (not depicted), specialized ROM/ASIC/PLD based devices such as security dongles (not depicted), and the like.

Those skilled in the art should also understand that term "computer readable media" as used in connection with the presently disclosed subject matter does not encompass transmission media, carrier waves, or other transitory signals.

Computer system (2000) can also include an interface (2054) to one or more communication networks (2055). Networks can for example be wireless, wireline, optical. Networks can further be local, wide-area, metropolitan, vehicular and industrial, real-time, delay-tolerant, and so on. Examples of networks include local area networks such as Ethernet, wireless LANs, cellular networks to include GSM, 3G, 4G, 5G, LTE and the like, TV wireline or wireless wide area digital networks to include cable TV, satellite TV, and terrestrial broadcast TV, vehicular and industrial to include CANBus, and so forth. Certain networks commonly require external network interface adapters that attached to certain general purpose data ports or peripheral buses (2049) (such as, for example USB ports of the computer system (2000)); others are commonly integrated into the core of the computer system (2000) by attachment to a system bus as described below (for example Ethernet interface into a PC computer system or cellular network interface into a smartphone computer system). Using any of these networks, computer system (2000) can communicate with other entities. Such communication can be uni-directional, receive only (for example, broadcast TV), uni-directional send-only (for example CANbus to certain CANbus devices), or bi-directional, for example to other computer systems using local or wide area digital networks. Certain protocols and protocol stacks can be used on each of those networks and network interfaces as described above.

Aforementioned human interface devices, human-accessible storage devices, and network interfaces can be attached to a core (2040) of the computer system (2000).

The core (2040) can include one or more Central Processing Units (CPU) (2041), Graphics Processing Units (GPU) (2042), specialized programmable processing units in the form of Field Programmable Gate Areas (FPGA) (2043), hardware accelerators for certain tasks (2044), graphics adapters (2050), and so forth. These devices, along with Read-only memory (ROM) (2045), Random-access memory (2046), internal mass storage such as internal non-user accessible hard drives, SSDs, and the like (2047), may be connected through a system bus (2048). In some computer systems, the system bus (2048) can be accessible in the form of one or more physical plugs to enable extensions by additional CPUs, GPU, and the like. The peripheral devices can be attached either directly to the core's system bus (2048), or through a peripheral bus (2049). In an example, the screen (2010) can be connected to the graphics adapter (2050). Architectures for a peripheral bus include PCI, USB, and the like.

CPUs (2041), GPUs (2042), FPGAs (2043), and accelerators (2044) can execute certain instructions that, in combination, can make up the aforementioned computer code. That computer code can be stored in ROM (2045) or RAM (2046). Transitional data can be also be stored in RAM (2046), whereas permanent data can be stored for example, in the internal mass storage (2047). Fast storage and retrieve to any of the memory devices can be enabled through the use of cache memory, that can be closely associated with one or more CPU (2041), GPU (2042), mass storage (2047), ROM (2045), RAM (2046), and the like.

The computer readable media can have computer code thereon for performing various computer-implemented operations. The media and computer code can be those specially designed and constructed for the purposes of the present disclosure, or they can be of the kind well known and available to those having skill in the computer software arts.

As an example and not by way of limitation, the computer system having architecture (2000), and specifically the core (2040) can provide functionality as a result of processor(s) (including CPUs, GPUs, FPGA, accelerators, and the like) executing software embodied in one or more tangible, computer-readable media. Such computer-readable media can be media associated with user-accessible mass storage as introduced above, as well as certain storage of the core (2040) that are of non-transitory nature, such as core-internal mass storage (2047) or ROM (2045). The software implementing various embodiments of the present disclosure can be stored in such devices and executed by core (2040). A computer-readable medium can include one or more memory devices or chips, according to particular needs. The software can cause the core (2040) and specifically the processors therein (including CPU, GPU, FPGA, and the like) to execute particular processes or particular parts of particular processes described herein, including defining data structures stored in RAM (2046) and modifying such data structures according to the processes defined by the software. In addition or as an alternative, the computer system can provide functionality as a result of logic hardwired or otherwise embodied in a circuit (for example: accelerator (2044)), which can operate in place of or together with software to execute particular processes or particular parts of particular processes described herein. Reference to software can encompass logic, and vice versa, where appropriate. Reference to a computer-readable media can encompass a circuit (such as an integrated circuit (IC)) storing software for execution, a circuit embodying logic for execution, or both, where appropriate. The present disclosure encompasses any suitable combination of hardware and software.

Appendix A: Acronyms

JEM: joint exploration model
VVC: versatile video coding
BMS: benchmark set
MV: Motion Vector
HEVC: High Efficiency Video Coding
SEI: Supplementary Enhancement Information
VUI: Video Usability Information
GOPs: Groups of Pictures
TUs: Transform Units,
PUs: Prediction Units
CTUs: Coding Tree Units
CTBs: Coding Tree Blocks
PBs: Prediction Blocks
HRD: Hypothetical Reference Decoder
SNR: Signal Noise Ratio
CPUs: Central Processing Units
GPUs: Graphics Processing Units
CRT: Cathode Ray Tube
LCD: Liquid-Crystal Display
OLED: Organic Light-Emitting Diode
CD: Compact Disc
DVD: Digital Video Disc
ROM: Read-Only Memory
RAM: Random Access Memory
ASIC: Application-Specific Integrated Circuit
PLD: Programmable Logic Device
LAN: Local Area Network
GSM: Global System for Mobile communications
LTE: Long-Term Evolution
CANBus: Controller Area Network Bus
USB: Universal Serial Bus PCI: Peripheral Component Interconnect
FPGA: Field Programmable Gate Areas
SSD: solid-state drive
IC: Integrated Circuit
CU: Coding Unit While this disclosure has described several exemplary embodiments, there are alterations, permutations, and various substitute equivalents, which fall within the scope of the disclosure. It will thus be appreciated that those skilled in the art will be able to devise numerous systems and methods which, although not explicitly shown or described herein, embody the principles of the disclosure and are thus within the spirit and scope thereof.

What is claimed is:

1. A method of video decoding in a decoder, comprising:
   determining, by a processor, a no transform skip residual coding rice constraint flag in a general constraint information (GCI) syntax structure for coding control in an output layer set of coded video data in a bitstream, the no transform skip residual coding rice constraint flag being associated with a coding tool of persistent Rice adaptation defined in a range extension of a video standard for a statistics based Rice parameter derivation in a residual coding;
   in response to the no transform skip residual coding rice constraint flag in the GCI syntax structure being equal to 1, decoding, by the processor, the output layer set of coded video data without invoking the coding tool;
   in response to the no transform skip residual coding rice constraint flag being equal to 0, determining whether a value of a transform skip residual coding rice present in slice header flag for one of one or more coded layer video sequences (CLVSs) in the output layer set in the bitstream indicates use of the coding tool;
   in response to the value of the transform skip residual coding rice present in slice header flag being indicative of using the coding tool in the one of the one or more CLVSs, determining statistics of coefficients decoded from one or more transform units prior to a current transform unit;
   determining an initial value of a Rice parameter for the current transform unit based on the statistics; and
   decoding coefficients of the current transform unit based on the Rice parameter, wherein
   the no transform skip residual coding rice constraint flag that is associated with the coding tool of persistent Rice adaptation is a GCI syntax element in the GCI syntax structure that defines a constraint applied to the output layer set that includes the one or more CLVSs.

2. The method of claim 1, wherein the no transform skip residual coding rice constraint flag being equal to 1 is indicative of disabling the coding tool in each of the one or more CLVSs in the output layer set.

3. The method of claim 1, further comprising:
   constraining the transform skip residual coding rice present in slice header flag for coding control of the one of the one or more CLVSs in the output layer set in the bitstream to have the value indicative of not using the coding tool for decoding the one of the one or more CLVSs, the transform skip residual coding rice present in slice header flag being a sequence parameter set (SPS) syntax element in an SPS syntax structure.

4. The method of claim 1, further comprising:
   in response to the no transform skip residual coding rice constraint flag being equal to 0, determining the value of the transform skip residual coding rice present in slice header flag for coding control of the one of the one or more CLVSs in the output layer set in the bitstream, the transform skip residual coding rice present in slice header flag being indicative of a use/no use of the coding tool in the one of the one or more CLVSs and being a sequence parameter set (SPS) syntax element in an SPS syntax structure.

5. The method of claim 4, wherein the determining the value of the transform skip residual coding rice present in slice header flag further comprises:
   inferring, in response to the transform skip residual coding rice present in slice header flag not being present in the SPS syntax structure for the one of the one or more CLVSs, the value of the transform skip residual coding rice present in slice header flag as indicating no use of the coding tool in the one of the one or more CLVSs.

6. The method of claim 1, wherein the determining the no transform skip residual coding rice constraint flag further comprises:
   decoding the no transform skip residual coding rice constraint flag from the GCI syntax structure in response to a syntax element in the GCI syntax structure indicating that additional bits for general constraint information are included in the GCI syntax structure.

7. An apparatus for video decoding, comprising:
   processing circuitry configured to:
   determine a no transform skip residual coding rice constraint flag in a general constraint information (GCI) syntax structure for coding control in an output layer set of coded video data in a bitstream, the no transform skip residual coding rice constraint flag being associated with a coding tool of persistent Rice adaptation defined in a range extension of a video standard for a statistics based Rice parameter derivation in a residual coding;
   in response to the no transform skip residual coding rice constraint flag in the GCI syntax structure being equal to 1, decode the output layer set of coded video data without invoking the coding tool; and
   in response to the no transform skip residual coding rice constraint flag being equal to 0, determine whether a value of a transform skip residual coding rice present in slice header flag for one of one or more coded layer video sequences (CLVSs) in the output layer set in the bitstream indicates use of the coding tool;
   in response to the value of the transform skip residual coding rice present in slice header flag being indicative of using the coding tool in the one of the one or more CLVSs, determine statistics of coefficients decoded from one or more transform units prior to a current transform unit;
   determine an initial value of a Rice parameter for the current transform unit based on the statistics; and
   decode coefficients of the current transform unit based on the Rice parameter, wherein
   the no transform skip residual coding rice constraint flag that is associated with the coding tool of persistent Rice adaptation is a GCI syntax element in the GCI syntax structure that defines a constraint applied to the output layer set that includes one or more CLVSs.

8. The apparatus of claim 7, wherein the no transform skip residual coding rice constraint flag being equal to 1 is indicative of disabling the coding tool in each of the one or more CLVSs in the output layer set.

9. The apparatus of claim 7, wherein the processing circuitry is configured to:

constrain the transform skip residual coding rice present in slice header flag for coding control of the one of the one or more CLVSs in the output layer set in the bitstream to have the value indicative of not using the coding tool for decoding the one of the one or more CLVSs, the transform skip residual coding rice present in slice header flag being a sequence parameter set (SPS) syntax element in an SPS syntax structure.

10. The apparatus of claim 7, wherein the processing circuitry is configured to:
in response to the no transform skip residual coding rice constraint flag being equal to 0, determine the value of the transform skip residual coding rice present in slice header flag for coding control of the one of the one or more CLVSs in the output layer set in the bitstream, the transform skip residual coding rice present in slice header flag being indicative of a use/no use of the coding tool in the one of the one or more CLVSs and being a sequence parameter set (SPS) syntax element in an SPS syntax structure.

11. The apparatus of claim 10, wherein the processing circuitry is configured to:
infer, in response to the transform skip residual coding rice present in slice header flag not being present in the SPS syntax structure for the one of the one or more CLVSs, the value of the transform skip residual coding rice present in slice header flag as indicating no use of the coding tool in the one of the one or more CLVSs.

12. The apparatus of claim 7, wherein the processing circuitry is configured to:
decode the no transform skip residual coding rice constraint flag from the GCI syntax structure in response to a syntax element in the GCI syntax structure indicating that additional bits for general constraint information are included in the GCI syntax structure.

13. A non-transitory computer-readable storage medium storing instructions which when executed by at least one processor cause the at least one processor to perform:
determining a no transform skip residual coding rice constraint flag in a general constraint information (GCI) syntax structure for coding control in an output layer set of coded video data in a bitstream, the no transform skip residual coding rice constraint flag being associated with a coding tool of persistent Rice adaptation defined in a range extension of a video standard for a statistics based Rice parameter derivation in a residual coding;
in response to the no transform skip residual coding rice constraint flag in the GCI syntax structure being equal to 1;
in response to the no transform skip residual coding rice constraint flag being equal to 0, determining whether a value of a transform skip residual coding rice present in slice header flag for one of one or more coded layer video sequences (CLVSs) in the output layer set in the bitstream indicates use of the coding tool;
in response to the value of the transform skip residual coding rice present in slice header flag being indicative of using the coding tool in the one of the one or more CLVSs, determining statistics of coefficients decoded from one or more transform units prior to a current transform unit;
determining an initial value of a Rice parameter for the current transform unit based on the statistics; and
decoding coefficients of the current transform unit based on the Rice parameter, wherein
the no transform skip residual coding rice constraint flag that is associated with the coding tool of persistent Rice adaptation is a GCI syntax element in the GCI syntax structure that defines a constraint applied to the output layer set that includes one or more CLVSs.

14. The non-transitory computer-readable storage medium of claim 13, wherein the no transform skip residual coding rice constraint flag being equal to 1 is indicative of disabling the coding tool in each of the one or more CLVSs in the output layer set.

15. The non-transitory computer-readable storage medium of claim 13, wherein the instructions cause the at least one processor to perform:
constraining the transform skip residual coding rice present in slice header flag for coding control of the one of the one or more CLVSs in the output layer set in the bitstream to have the value indicative of not using the coding tool for decoding the one of the one or more CLVSs, the transform skip residual coding rice present in slice header flag being a sequence parameter set (SPS) syntax element in an SPS syntax structure.

* * * * *